United States Patent
Kim et al.

(10) Patent No.: US 12,295,109 B2
(45) Date of Patent: May 6, 2025

(54) WINDOW AND DISPLAY DEVICE INCLUDING THE SAME

(71) Applicant: Samsung Display Co., Ltd., Yongin-si (KR)

(72) Inventors: Kyung-Man Kim, Anyang-si (KR); Dawoon Kim, Yongin-si (KR); Sanghoon Kim, Hwaseong-si (KR); Sunghoon Kim, Hwaseong-si (KR); Seungho Kim, Asan-si (KR); Yuri Kim, Guri-si (KR); Min-Hoon Choi, Seoul (KR); Seongjin Hwang, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 203 days.

(21) Appl. No.: 17/957,450

(22) Filed: Sep. 30, 2022

(65) Prior Publication Data
US 2023/0199982 A1    Jun. 22, 2023

(30) Foreign Application Priority Data
Dec. 20, 2021   (KR) .................. 10-2021-0182399

(51) Int. Cl.
*H05K 5/02*   (2006.01)
*H04M 1/02*   (2006.01)

(52) U.S. Cl.
CPC ........ *H05K 5/0217* (2013.01); *H04M 1/0268* (2013.01)

(58) Field of Classification Search
CPC .......................... H05K 5/0017; H05K 5/0217
USPC .................................. 361/807, 755, 809, 810
See application file for complete search history.

(56) References Cited

U.S. PATENT DOCUMENTS

| | | |
|---|---|---|
| 9,209,420 B2 | 12/2015 | Han et al. |
| 9,429,999 B2 | 8/2016 | Lee et al. |
| 2015/0043174 A1* | 2/2015 | Han .................. G02F 1/13452 428/156 |
| 2015/0049428 A1* | 2/2015 | Lee ...................... G06F 1/1652 361/679.27 |
| 2016/0224068 A1* | 8/2016 | Choi ..................... G06F 3/045 |

(Continued)

FOREIGN PATENT DOCUMENTS

| | | |
|---|---|---|
| KR | 102039496 B1 | 11/2019 |
| KR | 102056314 B1 | 12/2019 |

(Continued)

*Primary Examiner* — Hung S. Bui
(74) *Attorney, Agent, or Firm* — CANTOR COLBURN LLP

(57) ABSTRACT

A window includes: a folding part foldable around a virtual folding axis extending in a first direction, and first and second non-folding parts spaced apart from each other in a second direction perpendicular to the first direction with the folding part therebetween. A plurality of groove patterns extending in the first direction and arranged in the second direction are defined in the folding part. The folding part includes a first part adjacent to the folding axis, a third part adjacent to one of the first and second non-folding parts and a second part between the first part and the third part. widths of the first to third parts in the second direction are the same. A volume of the first part is greater than a volume of the second part, and the volume of the second part is greater than a volume of the third part.

19 Claims, 19 Drawing Sheets

(56) References Cited

U.S. PATENT DOCUMENTS

| | | | | |
|---|---|---|---|---|
| 2021/0191467 A1* | 6/2021 | Sunwoo | ............... | G06F 1/1641 |
| 2021/0282285 A1* | 9/2021 | Sunwoo | ................... | B32B 1/00 |
| 2022/0201879 A1* | 6/2022 | Kwak | .................. | G06F 1/1641 |
| 2022/0206529 A1* | 6/2022 | Lee | ...................... | G06F 1/1641 |
| 2022/0374046 A1* | 11/2022 | Kim | ..................... | G06F 1/1652 |

FOREIGN PATENT DOCUMENTS

| KR | 102176216 B1 | 11/2020 |
|---|---|---|
| KR | 102181655 B1 | 11/2020 |

\* cited by examiner

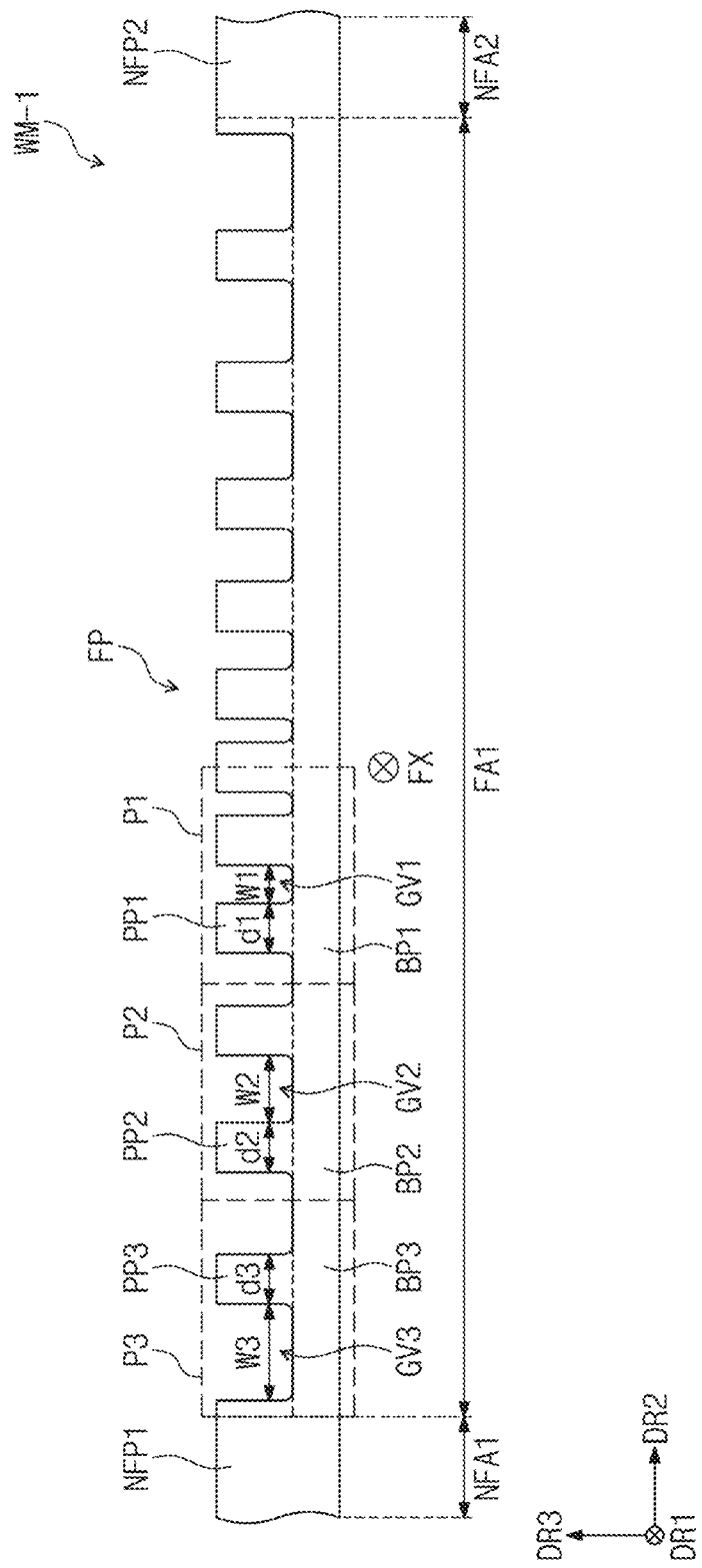

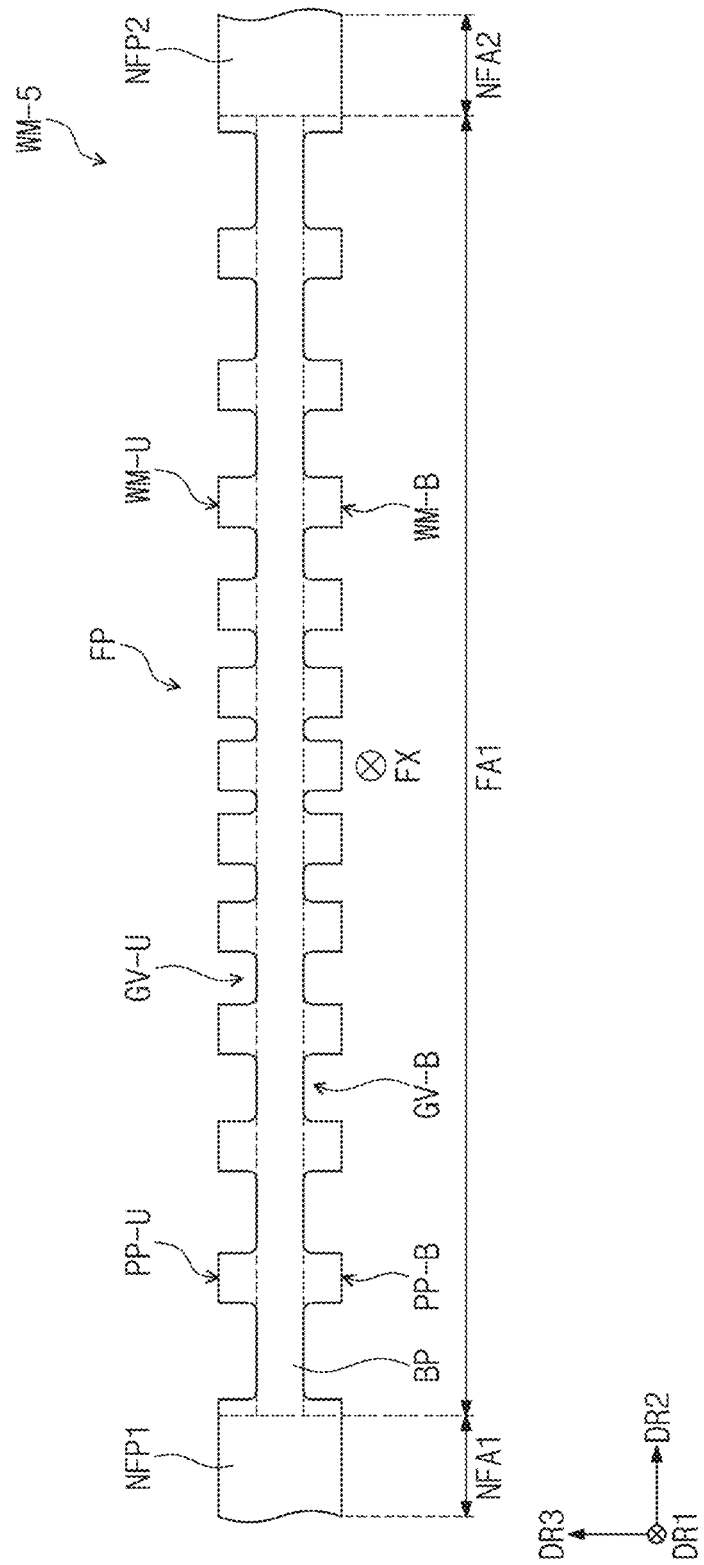

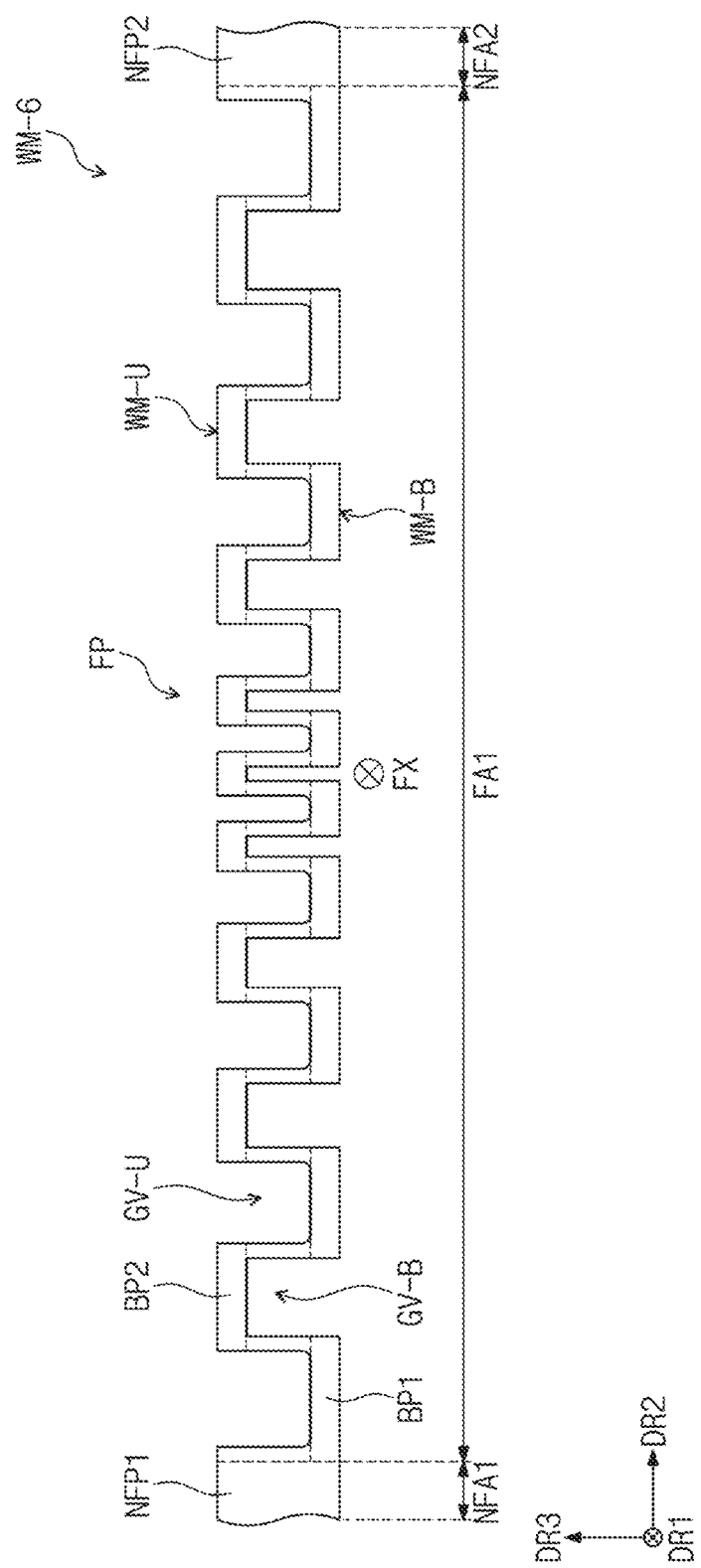

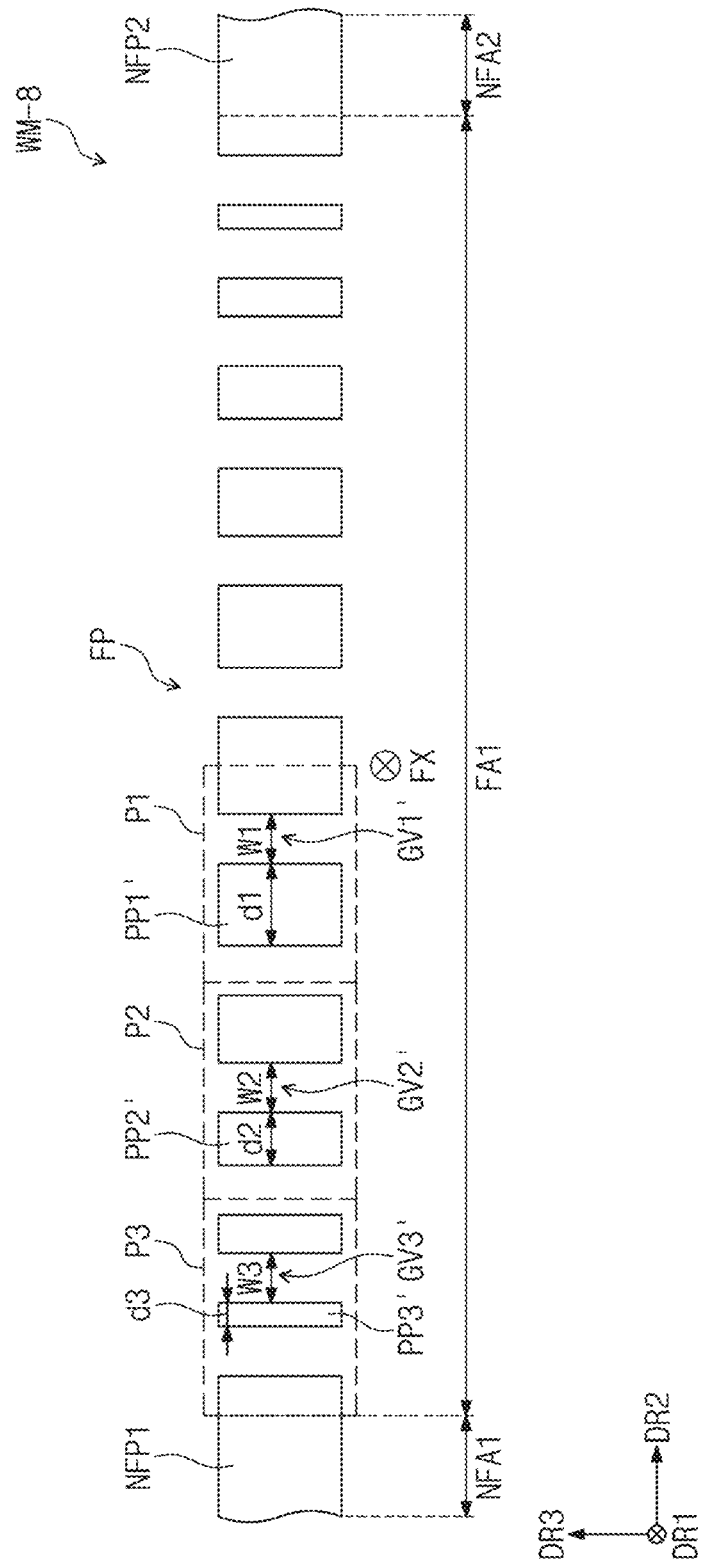

WINDOW AND DISPLAY DEVICE INCLUDING THE SAME

This application claims priority to Korean Patent Application No. 10-2021-0182399, filed on Dec. 20, 2021, and all the benefits accruing therefrom under 35 U.S.C. § 119, the content of which in its entirety is herein incorporated by reference.

BACKGROUND

The invention relates to a window and a display device including the same, and more particularly, to a foldable window and a display device including the same.

A display device is used in various multimedia devices such as a television, a mobile phone, a tablet computer, and a game machine to provide image information to a user. Various types of foldable or bendable flexible display devices have been developed. The flexible display device may be variously changed in shape, such as folded, rolled, or bent, and thus has a feature of being easy to carry.

The flexible display device may include a foldable or bendable display panel and a window. However, there is an issue in that the window of the flexible display device is deformed by a folding or bending operation or easily damaged by an external impact.

SUMMARY

The invention provides a window having excellent folding characteristics and excellent mechanical properties.

The invention also provides a display device including a window having excellent folding characteristics and excellent mechanical properties.

An embodiment of the invention provides a window including a folding part that is foldable with respect to a virtual folding axis extending in a first direction, and a first non-folding part and a second non-folding part spaced apart from each other in a second direction perpendicular to the first direction with the folding part therebetween, where a plurality of groove patterns extending in the first direction and arranged in the second direction are defined in the folding part, where the folding part includes a first part adjacent to the folding axis, a second part spaced apart from the folding axis more than the first part, and a third part adjacent to one of the first non-folding part and the second non-folding part, and spaced apart from the folding axis more than each of the first part and the second part, where widths of the first part, the second part and the third part in the second direction are the same, where a volume of the first part is greater than a volume of the second part, and the volume of the second part is greater than a volume of the third part.

In an embodiment, the plurality of groove patterns may include: a first groove pattern defined in the first part; a second groove pattern defined in the second part; and a third groove pattern defined in the third part, where a volume of a first space defined by the first groove pattern may be less than a volume of a second space defined by the second groove pattern, and the volume of the second space may be less than a volume of a third space defined by the third groove pattern.

In an embodiment, the first groove pattern may have a first width along the second direction, where the second groove pattern may have a second width along the second direction, where the third groove pattern may have a third width along the second direction, where the first width may be less than the second width, and the second width may be less than the third width.

In an embodiment, a difference between the first width and the third width may be at least about 10 micrometers.

In an embodiment, the folding part may include: a base part; and a plurality of protruding parts disposed on the base part, where each of the plurality of groove patterns is defined therebetween, where the base part may include: a first base part included in the first part; a second base part included in the second part; and a third base part included in the third part, where an average thickness of the first base part may be greater than an average thickness of the second base part, and the average thickness of the second base part may be greater than an average thickness of the third base part.

In an embodiment, the folding part may include a plurality of protruding parts in which the plurality of groove patterns are defined therebetween, where the plurality of protruding parts may include: a first protruding part included in the first part; a second protruding part included in the second part; and a third protruding part included in the third part, where the first protruding part may have a first protruding width along the second direction, where the second protruding part may have a second protruding width along the second direction, where the third protruding part may have a third protruding width along the second direction, where the first protruding width may be greater than the second protruding width, and the second protruding width may be greater than the third protruding width.

In an embodiment, a thickness of the window may be equal to or more than about 100 micrometers and equal to or less than about 1000 micrometers.

In an embodiment, the folding part may include: an upper surface; and a lower surface opposite to the upper surface, where the plurality of groove patterns include: a plurality of upper groove patterns recessed from the upper surface; and a plurality of lower groove patterns recessed from the lower surface.

In an embodiment, the plurality of upper groove patterns and the plurality of lower groove patterns may be alternately disposed along the second direction.

In an embodiment, the plurality of upper groove patterns and the plurality of lower groove patterns may be disposed so as to completely overlap each other in a plan view.

In an embodiment, the folding part may include: an upper surface; and a lower surface opposite to the upper surface, where the plurality of groove patterns may have a through-hole shape passing through the lower surface from the upper surface.

In an embodiment, the plurality of groove patterns may be symmetrical with respect to the folding axis.

In an embodiment, widths of the plurality of groove patterns in the second direction may be each equal to or more than about 20 micrometers and equal to or less than about 300 micrometers.

In an embodiment, in a state in which the window is folded, a radius of curvature of the first part may be less than a radius of curvature of the second part, and the radius of curvature of the second part may be less than a radius of curvature of the third part.

In an embodiment, the plurality of groove patterns may not overlap the first non-folding part and the second non-folding part in an unfolded state.

In an embodiment of the invention, a window includes: a folding part that is folded with respect to a virtual folding axis extending in a first direction; and a first non-folding part and a second non-folding part spaced apart from each other in a second direction perpendicular to the first direction with the folding part therebetween, where a plurality of groove patterns extending in the first direction and arranged in the second direction are defined in the folding part, where each of the plurality of groove patterns includes: a bottom surface recessed from an upper surface of the folding part and parallel to the upper surface in an unfolded state; and a side surface connecting the bottom surface and the upper surface, where when defining an area of the folding part an area occupied by the plurality of groove patterns on a cross section as a first area, the first area per unit width decreases in a direction away from the folding axis along the second direction.

In an embodiment of the invention, a display device includes: a foldable display module; and a window disposed on the display module and foldable together with the display module, where the window includes: a folding part that is foldable with respect to a virtual folding axis extending in a first direction; and a first non-folding part and a second non-folding part spaced apart from each other in a second direction perpendicular to the first direction with the folding part therebetween, where a plurality of groove patterns extending in the first direction and arranged in the second direction are defined in the folding part, where the folding part includes: a first part adjacent to the folding axis; a second part spaced apart from the folding axis more than the first part; and a third part adjacent to one of the first non-folding part and the second non-folding part, and spaced apart from the folding axis more than each of the first part and the second part, where widths of the first part, the second part and the third part in the second direction are the same, where a volume of the first part is greater than a volume of the second part, and the volume of the second part is greater than a volume of the third part.

In an embodiment, the folding part may include: a lower surface adjacent to the display module; and an upper surface facing the lower surface and spaced apart from the display module with the lower surface therebetween, where the plurality of groove patterns may include: a bottom surface recessed from the upper surface and parallel to the upper surface in an unfolded state; and a side surface connecting the bottom surface and the upper surface.

In an embodiment, the plurality of groove patterns may include: a first groove pattern defined in the first part; a second groove pattern defined in the second part; and a third groove pattern defined in the third part, where a volume of a first space defined by the first groove pattern may be less than a volume of a second space defined by the second groove pattern, and the volume of the second space may be less than a volume of a third space defined by the third groove pattern.

BRIEF DESCRIPTION OF THE FIGURES

The accompanying drawings are included to provide a further understanding of the invention, and are incorporated in and constitute a part of this specification. The drawings illustrate embodiments of the invention and, together with the description, serve to explain principles of the invention. In the drawings:

FIGS. 6A to 6C are each a cross-sectional view illustrating a part of a cross-section of a window according to an embodiment of the invention;

FIGS. 7A to 7C are each a cross-sectional view illustrating a part of a cross-section of a window according to an embodiment of the invention;

FIGS. 8A and 8B are each a cross-sectional view illustrating a part of a cross-section of a window according to an embodiment of the invention;

DETAILED DESCRIPTION

Figure 1:
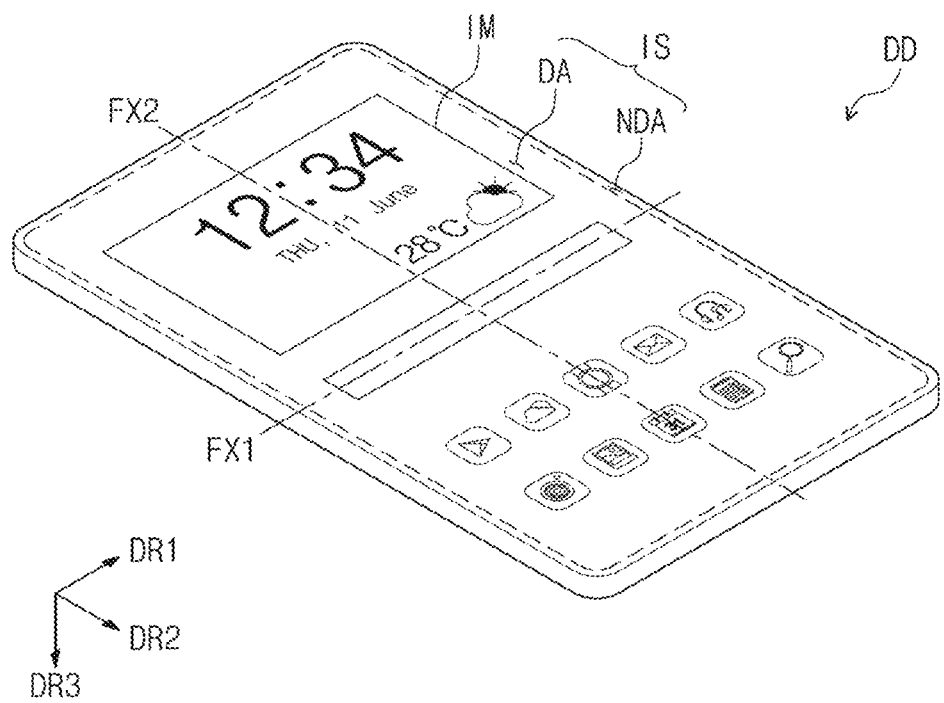
FIG. 1 is a perspective view illustrating an unfolded state of a display device according to an embodiment.

In this specification, when an element (or region, layer, part, etc.) is referred to as being "on", "connected to", or "coupled to" another element, it means that it may be directly placed on/connected to/coupled to other components, or a third component may be arranged between them.

Like reference numerals refer to like elements. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." Additionally, in the drawings, the thicknesses, proportions, and dimensions of components are exaggerated for effective description. "And/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the invention. The terms of a singular form may include plural forms unless otherwise specified.

In addition, terms such as "below", "the lower side", "on", and "the upper side" are used to describe a relationship of components shown in the drawing. The terms are described as a relative concept based on a direction shown in the drawing.

In various embodiments of the invention, the term "include," "comprise," "including," or "comprising," specifies a property, a region, a fixed number, a step, a process, an element and/or a component but does not exclude other properties, regions, fixed numbers, steps, processes, elements and/or components.

Meanwhile, in the present specification, "directly disposed" may mean that there is no layer, film, region, plate, and the like added between a portion such as a layer, film, region, or plate and another portion. For example, "directly disposed" may mean disposing between two layers or two members without using an additional member such as an adhesive member.

Unless otherwise defined, all terms (including technical and scientific terms) used herein have the same meaning as commonly understood by one of ordinary skill in the art to which this invention belongs. In addition, terms such as terms defined in commonly used dictionaries should be interpreted as having a meaning consistent with the meaning in the context of the related technology, and it should not be construed in an overly ideal or overly formal sense unless explicitly defined here.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value. Hereinafter, embodiments of the invention will be described with reference to the drawings.

FIG. 1 is a perspective view illustrating an unfolded state of a display device according to an embodiment. FIGS. 2A to 2D are each a perspective view illustrating a folded state of a display device according to an embodiment.

The display device DD may be activated according to an electrical signal to provide an image IM. The display device DD may be used in various electronic devices to display the image IM. For example, the display device DD may be used in large electronic devices such as televisions and monitors, and small and medium-sized electronic devices such as mobile phones, tablets, car navigation systems, and game machines. However, unless departing from the concept of the invention, the display device DD is not limited to the above-described examples and may be used in various electronic devices.

Referring to FIG. 1, a front surface of the display device DD may be defined as a display surface IS. In the unfolded state, the display surface IS of the display device DD may correspond to a plane defined by the first direction DR1 and the second direction DR2 intersecting the first direction DR1. The display surface IS may display the image IM in an upward direction, that is, in a direction opposite to the third direction DR3.

On the other hand, first to third directions DR1, DR2, DR3 are shown in the drawings of the present specification, and the first to third directions DR1, DR2, and DR3 described herein are relative concepts and may be converted into other directions. In each of the drawings, directions indicated by the first to third directions DR1, DR2, and DR3 are illustrated using the same reference numerals.

In this specification, the front surface (or upper surface) and the rear surface (or lower surface) of each component may be defined based on the direction in which the image IM is displayed. The upper and lower surfaces may face each other in the third direction DR3, and respective normal directions of the upper and lower surfaces may be parallel to the third direction DR3. A distance spaced apart along the third direction DR3 between the upper and lower surfaces of the structure may correspond to the thickness of the structure. In this specification, "on a plane" may correspond to looking at the configuration in the third direction DR3.

The display surface IS of the display device DD may include a display area DA and a non-display area NDA. The display area DA may be an area in which the image IM is displayed. The non-display area NDA may be an area in which the image IM is not displayed. The user may recognize the image IM displayed through the display area DA. The image IM may be a dynamic image or a static image.

FIG. 1 illustrates a plurality of application icons and a clock widget as an example of an image IM.

The display area DA may have a rectangular shape. However, this is illustrated by way of example, and the shape of the display area DA may be designed in various ways. The non-display area NDA may surround the display area DA. However, the invention is not limited thereto, and the non-display area NDA may be adjacent to only one side of the display area DA or may be omitted in another embodiment.

As illustrated in FIG. 1, the display device DD has a short side extending in the first direction DR1, a long side extending in the second direction DR2, and a rectangular shape with rounded corners on a plan view. However, the shape of the display device DD is not limited thereto, and various shapes may be provided.

Meanwhile, although the display device DD in which the cross-sectional display surface IS is defined is illustrated as an example, but the display device DD may have a double-sided display surface in which the display surface IS is defined on both a cross-section and a rear surface. Examples of the display surface of the display device DD are not limited to any one type.

The display device DD may be a foldable display device. The display device DD may be folded around a virtual folding axis extending in a predetermined direction. FIG. 1 exemplarily illustrates a first folding axis FX1 extending in a first direction DR1 and a second folding axis FX2 extending in a second direction DR2. The first folding axis FX1 may be parallel to the short side direction (e.g., first direction DR1) of the display device DD. The second folding axis FX2 may be parallel to the long side direction (e.g., second direction DR2) of the display device DD. The display device DD according to an embodiment may be folded with respect to at least one of the first folding axis FX1 and the second folding axis FX2.

Figure 2A:
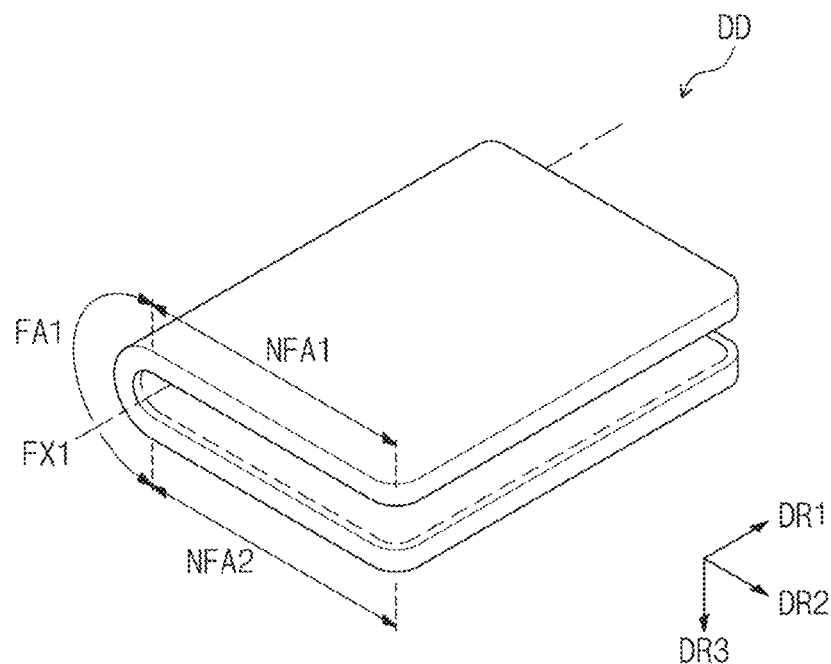
FIGS. 2A to 2D are each a perspective view illustrating a folded state of a display device according to an embodiment.
Figure 2B:
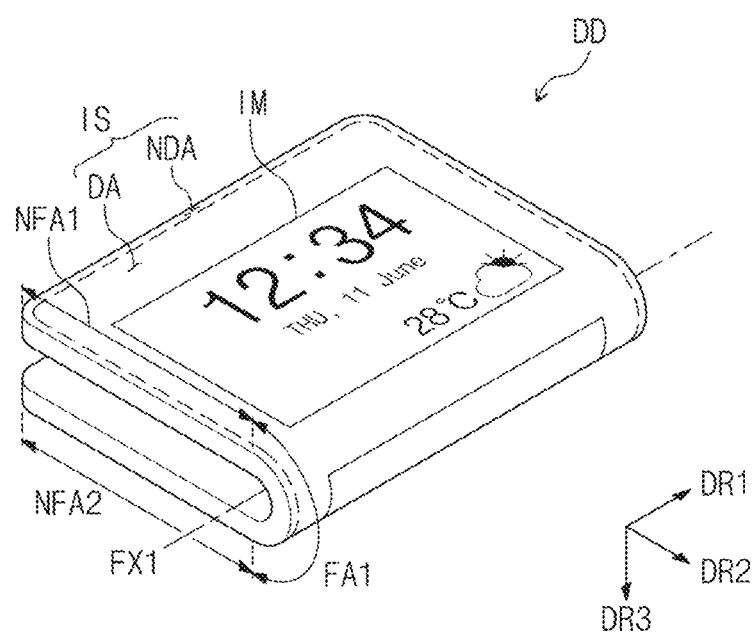
Figure 2C:
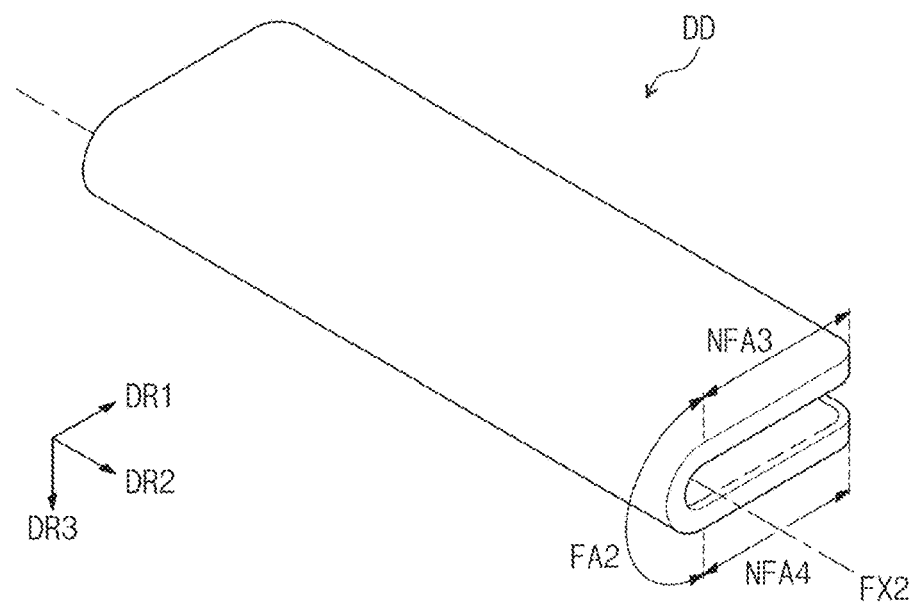
Figure 2D:
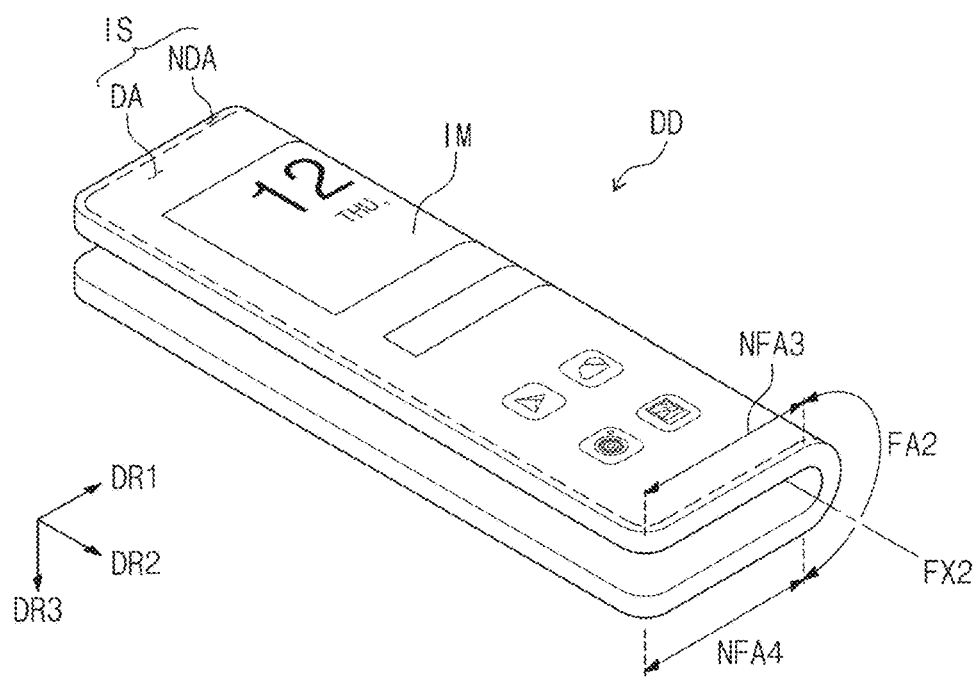

FIGS. 2A and 2B are perspective views of the display device DD according to an embodiment folded around the first folding axis FX1, and FIGS. 2C and 2D are perspective views of the display device DD according to an embodiment that is folded around the second folding axis FX2.

The display device DD may be divided into a folding area and a non-folding area according to an operation form. The folding area may be a curved area to have a predetermined curvature when the display device DD is folded around the folding axis. The non-folding area may be a flat area when the display device DD is folded around the folding axis.

The display device DD may include at least one folding area and a non-folding area. FIGS. 2A to 2D illustrate embodiments of the display device DD including one folding area and two non-folding areas adjacent to the folding area with respect to one folding axis. However, the invention is not limited thereto, and in another embodiment, the display device DD may include a plurality of folding areas that are folded with respect to a plurality of folding axes, respectively. The number of folding and non-folding areas included in the display device DD is not particularly limited.

Referring to FIGS. 2A and 2B, the display device DD folded around the first folding axis FX1 may include a first folding area FA1, a first non-folding area NFA1, and a second non-folding area NFA2. The first folding area FA1 may be an area that surrounds the first folding axis FX1 and is folded with a predetermined curvature. The first non-folding area NFA1 may be adjacent to one side of the first folding area FA1 in the second direction DR2, and the second non-folding area NFA2 may be adjacent to an opposite side of the first folding area FA1 in the second direction DR2.

Referring to FIGS. 2C and 2D, the display device DD folded around the second folding axis FX2 includes a second folding area FA2, a third non-folding area NFA3, and a fourth non-folding area NFA4. The second folding area FA2 may be an area that surrounds the second folding axis FX2 and is folded with a predetermined curvature. The third non-folding area NFA3 may be adjacent to one side of the second folding area FA2 in the first direction DR1, and the fourth non-folding area NFA4 may be adjacent to an opposite side of the second folding area FA2 in the first direction DR1.

The display device DD may be in-folding or out-folding. When the display surface IS overlapping the folding area of the display device DD is folded to face the folding axis, this may be defined as in-folding. When the rear surface overlapping the folding area of the display device DD is folded to face the folding axis, this may be defined as out-folding. The display device DD may be manufactured to enable both in-folding and out-folding operations, or may be manufactured to enable any one of in-folding and out-folding operations.

FIG. 2A illustrates the display device DD in-folded around the first folding axis FX1, and FIG. 2C illustrates the display device DD in-folded around the second folding axis FX2. FIG. 2B illustrates the display device DD that is out-folded around the first folding axis FX1, and FIG. 2D illustrates the display device DD that is out-folded around the second folding axis FX2.

Referring to FIG. 2A, the display surfaces IS overlapping the first non-folding area NFA1 and the second non-folding area NFA2 of the in-folded display device DD may face each other. Referring to FIG. 2C, the display surfaces IS overlapping the third non-folding area NFA3 and the fourth non-folding area NFA4 of the in-folded display device DD may face each other. A rear surface of the in-folded display device DD may be exposed to the outside.

Referring to FIG. 2B, the display surface IS overlapping the first non-folding area NFA1 and the second non-folding area NFA2 of the out-folded display device DD may be exposed to the outside in directions opposite to each other. Referring to FIG. 2D, the display surface IS overlapping the third non-folding area NFA3 and the fourth non-folding area NFA4 of the out-folded display device DD may be exposed to the outside in directions opposite to each other. Through this, the user may visually recognize the image IM provided by the display device DD in the folded state.

Figure 3:
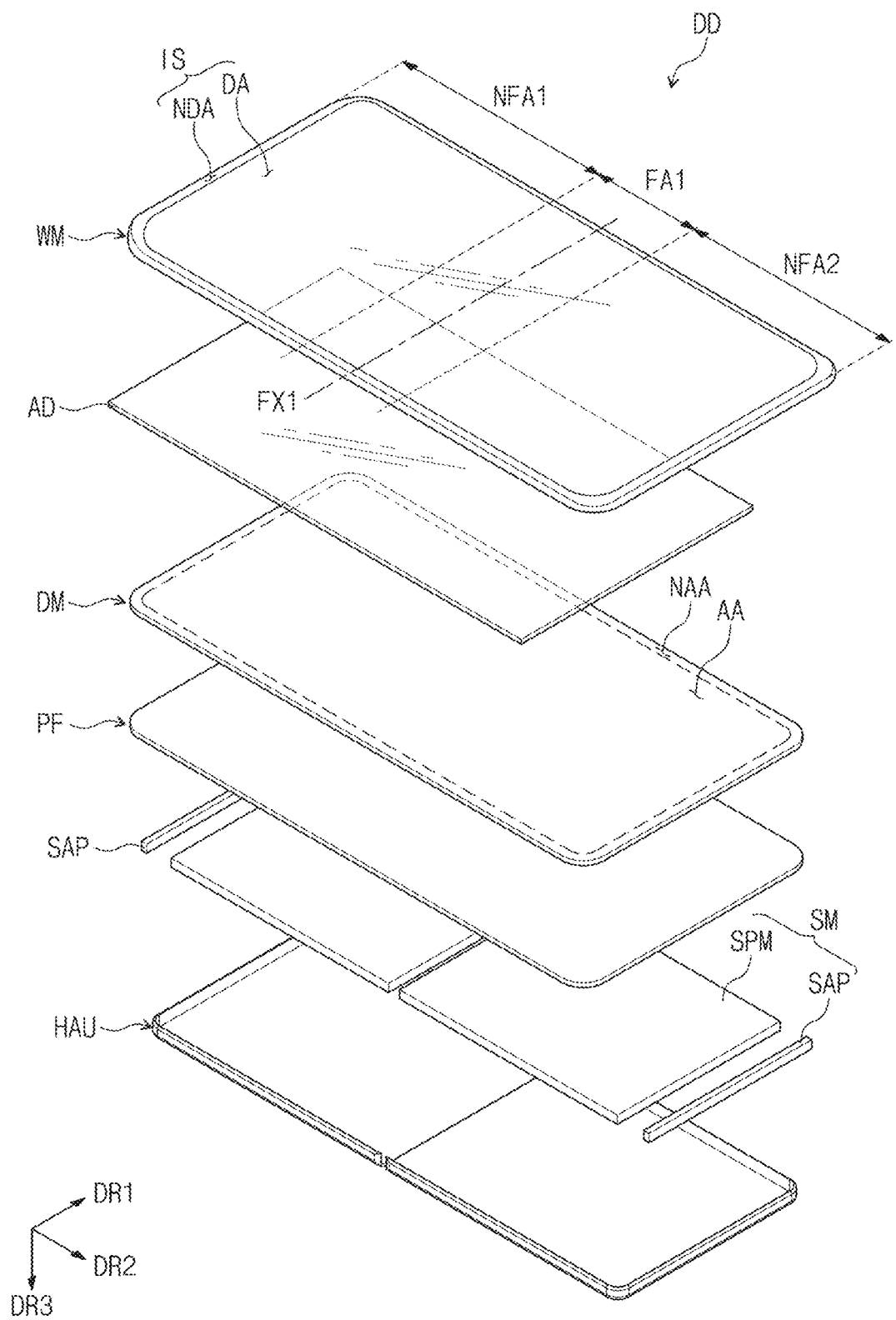
FIG. 3 is an exploded perspective view of a display device according to an embodiment.

FIG. 3 is an exploded perspective view of a display device according to an embodiment of the invention. FIG. 3 exemplarily illustrates an exploded perspective view of the display device DD foldable around the first folding axis FX1. The display device DD may include a display module DM, a window WM, and an adhesive layer AD. Meanwhile, the display device DD according to an embodiment may include a lower module SM and a protective layer PF disposed below the display module DM.

The display module DM may display an image according to an electrical signal, and may transmit and receive information about an external input. The display module DM may include an active area AA and a peripheral area NAA.

The active area AA may be defined as an area activated according to an electrical signal. For example, the display module DM may output an image through the active area AA or detect various types of external inputs. The active area AA may correspond to at least a part of the display area DA.

The peripheral area NAA may be adjacent to the active area AA. For example, the peripheral area NAA may surround the active area AA. However, this is illustrated by way of example, and the peripheral area NAA may be defined in various forms such as adjacent to one side of the active area AA, and is not limited thereto. The peripheral area NAA may correspond to at least a part of the non-display area NDA.

Although not shown separately, the display module DM may include a display panel. The display panel may generate an image emitted from the display module DM. The display panel may be a light emitting display panel, and is not particularly limited. For example, the display panel may be an organic light emitting display panel or a quantum dot light emitting display panel. Meanwhile, the display module DM may further include an input sensor disposed on the display panel and sensing an external input.

The display module DM may include a plurality of pixels disposed in the active area AA and a circuit unit disposed in the peripheral area NAA. The circuit unit may provide an electrical signal to the pixels to drive the pixels. The pixels may be arranged to form emission patterns in the active area AA. The light emitting patterns of the pixels receiving the electrical signal from the circuit unit may emit light in response to the electrical signal, thereby outputting an image in the active area AA.

The window WM may be disposed on the display module DM. The window WM may cover the entire upper surface of the display module DM. The shape of the window WM may correspond to the shape of the display module DM. The window WM mitigates an external shock, thereby preventing the display module DM from being damaged or malfunctioning due to the external shock.

The window WM may include an optically transparent material. The window WM may include an optically transparent substrate, which will be described later. For example, the window WM may include a glass substrate, and the glass substrate may be a tempered glass substrate that has been tempered.

The window WM may have a single-layer structure or a multi-layer structure. For example, the window WM may have a single-layer structure including a glass substrate, but is not limited thereto, and may have a multilayer structure including a coating film coated on a glass substrate, a filling member, or a polymer film disposed on the glass substrate in another embodiment.

The front surface of the window WM may correspond to the front surface of the display device DD. The front surface of the window WM may correspond to the display surface IS of the display device DD described above. The window WM may include the above-described display area DA and non-display area NDA.

The display area DA of the window WM may transmit an image emitted from the display module DM. The user may view the image through the display area DA of the window WM. The window WM may have a predetermined color overlapping the non-display area NDA. For example, the window WM may further include a printed layer formed on the glass substrate to overlap the non-display area NDA.

The window WM may be flexible. The window WM may be folded together with the display module DM around the folding axis FX. The window WM may include a first folding area FA1 that is curved to have a predetermined curvature when folded around the folding axis FX, and a plurality of non-folding areas NFA1 and NFA2 adjacent to the first folding area FA1.

In FIG. 3, the window WM has a rectangular shape with rounded corners. However, this is illustrated by way of example and the window WM may have various shapes corresponding to the display module DM. The shape of the window WM may vary depending on the design of the substrate manufactured through the window WM manufacturing process.

The adhesive layer AD may be disposed between the window WM and the display module DM. The adhesive layer AD may bond the window WM and the display module DM. The adhesive layer AD may be an optically clear adhesive film ("OCA") or an optically clear adhesive resin layer ("OCR"). The adhesive layer AD may be integrally formed with a filling member of the window WM, which will be described later, and is not limited to any one embodiment. Meanwhile, in an embodiment, the adhesive layer AD may be omitted.

Meanwhile, although not shown separately, the display device DD may further include at least one functional layer disposed between the display module DM and the window WM. For example, the display device DD may further include an anti-reflection layer that reduces the reflectance of external light incident from the upper side of the window WM.

The display device DD may include a housing HAU in which the display module DM and the lower module SM are accommodated. The housing HAU may be coupled to the window WM.

Although not shown, the housing HAU may further include a hinge structure for easy folding or bending. As shown in FIG. 3, the housing HAU may include a first housing and a second housing spaced apart along the second direction DR2, and the first housing and the second housing may be coupled to each other by a hinge structure portion. During the folding and unfolding operations of the display device DD, the display device DD may perform the folding and unfolding operations based on a portion of the hinge structure.

In the display device DD according to an embodiment, the protective layer PF may be disposed under the display module DM to protect the display module DM from external impact. The protective layer PF may be, for example, a polymer film such as a polyimide film or a polyethylene terephthalate film.

In the display device DD according to an embodiment, the lower module SM may include a support member SPM and a filling unit SAP. The support member SPM may be a portion overlapping most of the display module DM. The filling unit SAP may be a portion disposed outside the support member SPM and overlapping the outside of the display module DM.

The support member SPM may include at least one of a support plate, a cushion layer, a shielding layer, and an interlayer bonding layer formed of a metal material or a polymer material. The support member SPM may support the display module DM or may prevent the display module DM from being deformed due to an external impact or force.

The cushion layer may include a sponge, foam, or an elastomer such as a urethane resin. In addition, the cushion layer may be formed including at least one of an acrylic polymer, a urethane polymer, a silicone polymer, and an imide polymer. The shielding layer may be an electromagnetic wave shielding layer or a heat dissipating layer. In addition, the shielding layer may function as a bonding layer. The interlayer bonding layer may be provided in the form of a bonding resin layer or an adhesive tape. The interlayer bonding layer may bond members included in the support member SPM.

The filling unit SAP may be disposed outside the support member SPM. The filling unit SAP may be disposed between the display module DM and the housing HAU. The filling unit SAP may fill a space between the protective layer PF and the housing HAU and fix the protective layer PF.

Although not shown, the display device DD according to an embodiment may further include an adhesive layer disposed between the protective layer PF and the lower module SM. The adhesive layer may be an optically clear adhesive film (OCA) or an optically clear adhesive resin layer (OCR).

Figure 4A:
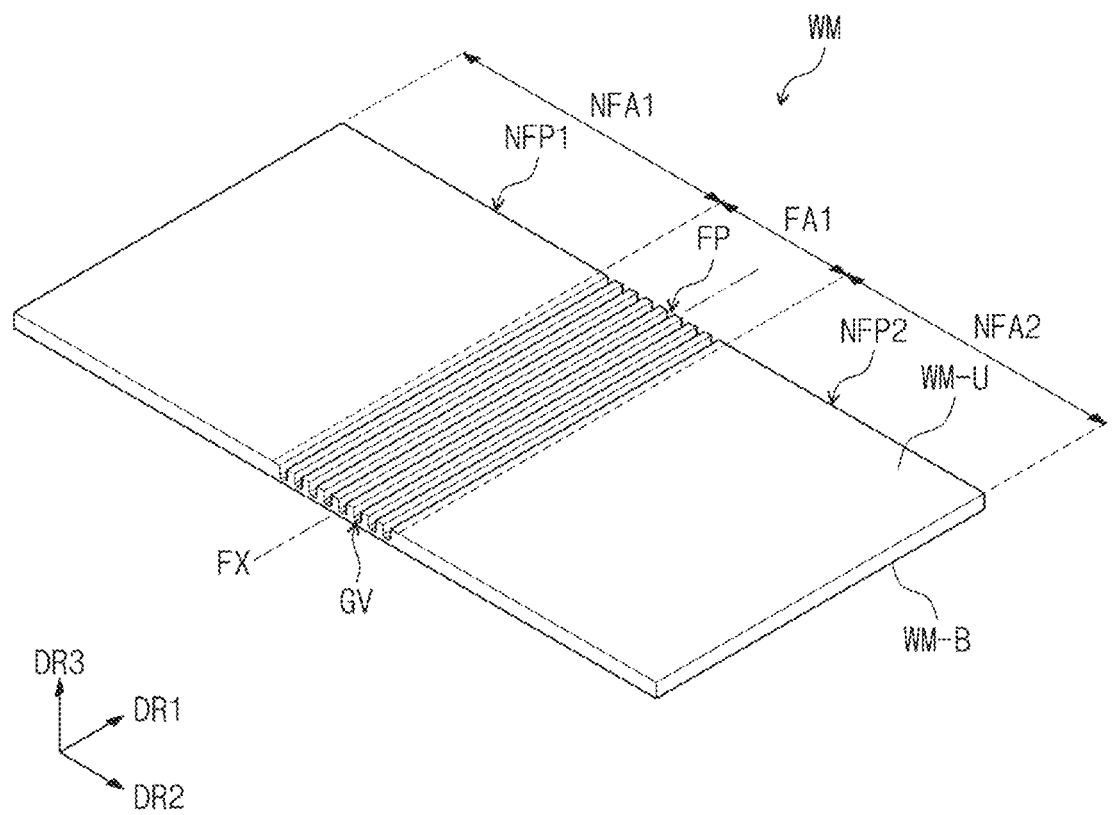
FIGS. 4A and 4B are each a perspective view of a window according to an embodiment of the invention.
Figure 4B:
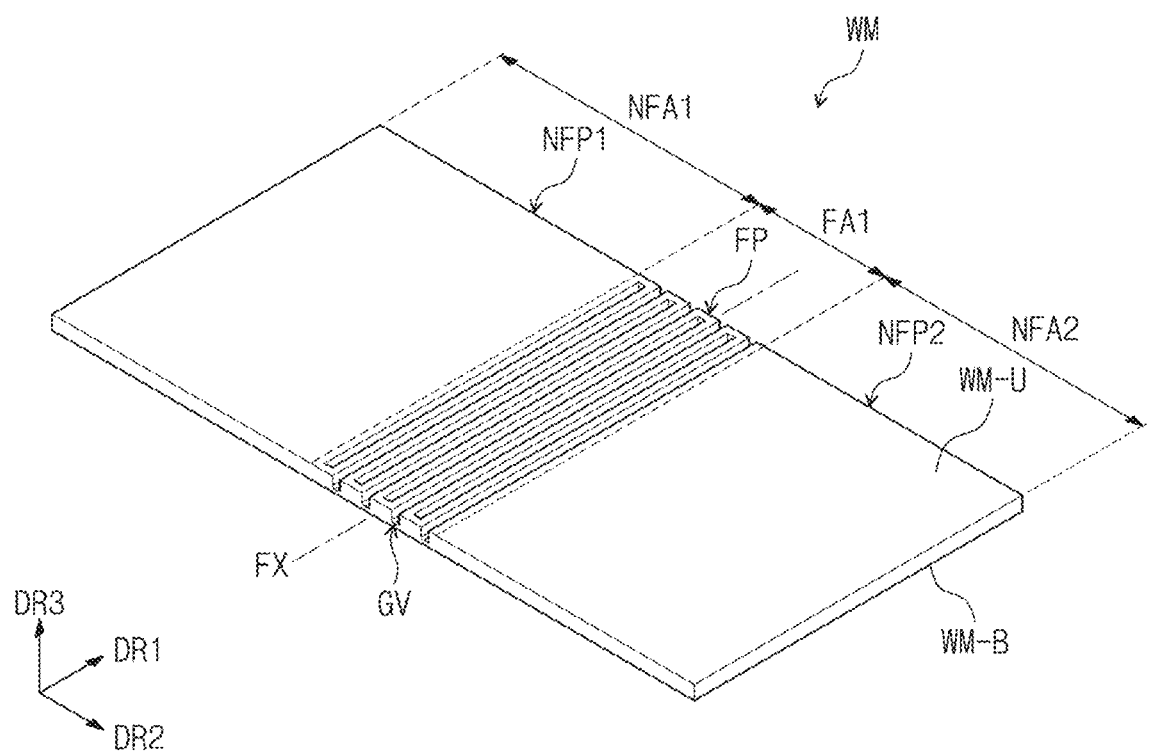

FIGS. 4A and 4B are each a perspective view of a window according to an embodiment of the invention. The window WM of the embodiments shown in FIGS. 4A and 4B may be disposed on the display module DM and used in the display device DD, and the above-described description regarding the window WM may be equally applied.

Referring to FIGS. 4A and 4B, the window WM may be folded around a virtual folding axis FX. The folding axis FX may extend along the first direction DR1 parallel to the short side of the window WM. The folding axis FX illustrated in FIGS. 4A and 4B may correspond to the first folding axis FX1 of FIG. 3. However, the invention is not limited thereto, and in another embodiment, the window WM may be folded around a folding axis extending in a direction parallel to the long side of the window WM, that is, the second folding axis FX2 of FIG. 1. The shape of the foldable window WM is not limited to any one embodiment.

The window WM includes a folding part FP overlapping the first folding area FA1 and non-folding parts NFP1 and NFP2 spaced apart from each other in the second direction DR2 with the folding part FP therebetween. The non-folding parts NFP1 and NFP2 include a first non-folding part NFP1 overlapping the first non-folding area NFA1, and a second non-folding part NFP2 overlapping the second non-folding area NFA2. The folding part FP may be a part foldable with a predetermined curvature with respect to the folding axis FX. The first non-folding part NFP1 may be adjacent to one side of the folding part FP along the second direction DR2, and the second non-folding part NFP2 may be adjacent to an opposite side of the folding part FP in the second direction DR2. Meanwhile, the number of folding parts and non-folding parts included in the window WM is not limited to the illustrated embodiment.

The window WM may include an upper surface WM-U and a lower surface WM-B. The upper surface WM-U and the lower surface WM-B of the window WM may be parallel to a plane defined by the first direction DR1 and the second direction DR2 in the unfolded state. The upper surface WM-U and the lower surface WM-B of the window WM may face each other.

The lower surface WM-B of the window WM may face the folding axis FX. The lower surface WM-B of the window WM may be closer to the folding axis FX in the third direction DR3 compared to the upper surface WM-U. The lower surface WM-B of the folded window WM may be folded downward while surrounding the folding axis FX. However, the invention is not necessarily limited thereto, and the upper surface WM-U of the window WM may face the folding axis FX in another embodiment.

The window WM includes an upper surface WM-U and a lower surface WM-B parallel to each of the first direction DR1 and the second direction DR2 in the unfolded state, and may have a rectangular parallelepiped shape. A thickness of the window WM is defined as a distance between the upper surface WM-U and the lower surface WM-B along the third direction DR3. FIGS. 4A and 4B exemplarily show a window WM having right-angled corners. However, the invention is not limited thereto, and in another embodiment, the window WM may have a rectangular parallelepiped shape with rounded corners corresponding to the shape of the window WM of FIG. 3.

The window WM may include an optically transparent material. For example, the window WM may include a glass substrate, specifically, a strengthened glass substrate. Since the window WM includes a glass substrate, it may have excellent esthetics and may prevent nicks or scratches by sharp materials.

The window WM may have a predetermined thickness along the third direction DR3. The thickness of the window WM may affect the impact resistance of the window WM. When the thickness of the window WM is too thin, the window WM may be broken or damaged by an impact (e.g., an impact caused by a pen drop) concentrated in a local area. When the thickness of the window WM is too thick, flexibility may be reduced or broken when folded. For example, the thickness of the window WM may be about 100 micrometers (μm) or more. In an embodiment, the thickness of the window WM may be equal to or more than about 100 micrometers and equal to or less than about 1000 micrometers. However, the thickness of the window WM is not necessarily limited to the numerical example. As the window WM has a thickness within the above range, the impact resistance of the window WM is secured, thereby protecting the display module DM to be disposed under the window WM.

A plurality of groove patterns GV may be defined in the window WM.

The plurality of groove patterns GV may be defined in the folding part FP of the window WM. The plurality of groove patterns GV may be disposed to overlap the folding area FA1. The plurality of groove patterns GV may not be defined in the first non-folding part NFP1 and the second non-folding part NFP2. The plurality of groove patterns GV may not overlap the first non-folding part NFP1 and the second non-folding part NFP2. FIGS. 4A and 4B exemplarily show eight groove patterns GV disposed in the folding part FP. However, the number of the groove patterns GV is not limited thereto, and may be less or more in another embodiment.

Each of the plurality of groove patterns GV may extend in one direction. For example, each of the plurality of groove patterns GV may extend in a direction parallel to the direction in which the folding axis FX extends. FIGS. 4A and 4B exemplarily illustrate a plurality of groove patterns GV extending in a first direction DR1 parallel to the folding axis FX. However, the invention is not limited thereto, and the plurality of groove patterns GV may extend obliquely to cross the extending direction of the folding axis FX in another embodiment.

The plurality of groove patterns GV may be arranged along one direction crossing the folding axis FX. The plurality of groove patterns GV may be arranged to be spaced apart from each other with a portion of the upper surface WM-U of the window WM interposed therebetween. FIGS. 4A and 4B exemplarily illustrate a plurality of groove patterns GV spaced apart from each other along the second direction DR2.

Based on one of the plurality of groove patterns GV, the groove pattern GV may extend from one end (e.g., one long side of the window WM) to an opposite end (e.g., the other long side of the window WM) of the window WM. However, the invention is not limited thereto, and in another embodiment, the groove pattern GV may be surrounded by the upper surface WM-U of the window WM in a plan view. Referring to FIG. 4A, each of the plurality of groove patterns GV may extend from one side of the window WM extending along the second direction DR2 to an opposite side of the window WM extending along the second direction DR2. Referring to FIG. 4B, some of the plurality of groove patterns GV may extend in the first direction DR1 while being surrounded by the upper surface WM-U of the window WM on a plan view such that opposite ends of the some of the plurality of groove patterns GV may not reach the opposite sides of the window WM extending along the second direction DR2. Although not shown separately, all of the plurality of groove patterns GV may extend while being surrounded by the upper surface WM-U of the window WM in still another embodiment.

The plurality of groove patterns GV may be formed by recessing portions of the window WM from the upper surface WM-U to the lower surface WM-B of the window WM. Each of the groove patterns GV is recessed from the upper surface WM-U of the window WM and may be defined as a side surface and a bottom surface connected to the upper surface WM-U of the window WM. Each of the groove patterns GV may include a bottom surface parallel to the upper surface WM-U in an unfolded state and a side surface connecting the bottom surface and the upper surface WM-U of the window WM. The shape and arrangement of the groove patterns GV will be described in detail later with reference to the drawings.

As the plurality of groove patterns GV are disposed in the folding area FA1, the folding characteristic of the window WM may be improved. The thickness of a portion of the window WM overlapping the folding area FA1 by the plurality of groove patterns GV may be relatively thin, and flexibility of the window WM may be improved. When folded, the folding area FA1 of the window WM may be bent to a predetermined curvature, and a compressive or tensile stress may be applied to the inside of the window WM in the folding area FA1. The plurality of groove patterns GV may reduce a compressive or tensile stress acting within the window WM to prevent damage due to folding of the window WM.

Although not shown, the window WM may further include a filling member disposed in the plurality of groove patterns GV. The filling member may contact bottom surfaces and side surfaces of the groove patterns GV. The shape of the filling member may correspond to the shape of the plurality of groove patterns GV. The filling member may absorb an external impact by filling the inner space formed by the groove patterns GV, and may supplement impact resistance in the folding area FA1 of the window WM.

The filling member may include organic matter. For example, the filling member may include a resin having elasticity. The filling member may prevent the window WM from being deformed by compressive or tensile stress applied during folding while maintaining the improved folding characteristics of the window WM.

The filling member may include an optically transparent material. Accordingly, the user may view the image provided through the display surface IS (see FIG. 3) overlapping the folding area FA1 of the window WM.

The filling member may include the same material as the above-described adhesive layer AD (see FIG. 3). The filling member may be formed integrally with the adhesive layer AD (see FIG. 3). However, the invention is not limited thereto, and in another embodiment, the filling member and the adhesive layer AD (see FIG. 3) may include different materials.

Figure 5A:
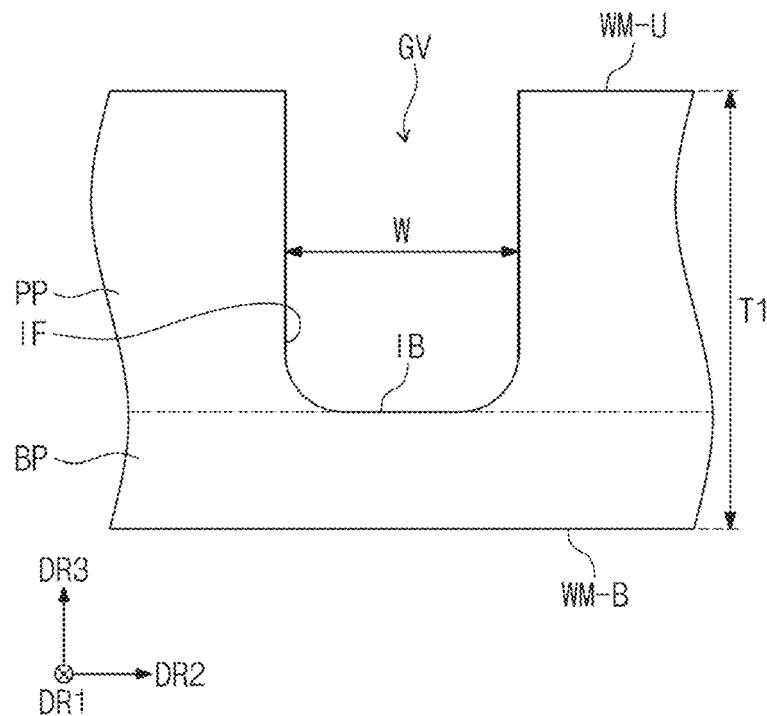
FIGS. 5A and 5B are each a cross-sectional view illustrating a cross-section of a single groove pattern according to an embodiment of the invention.
Figure 5B:
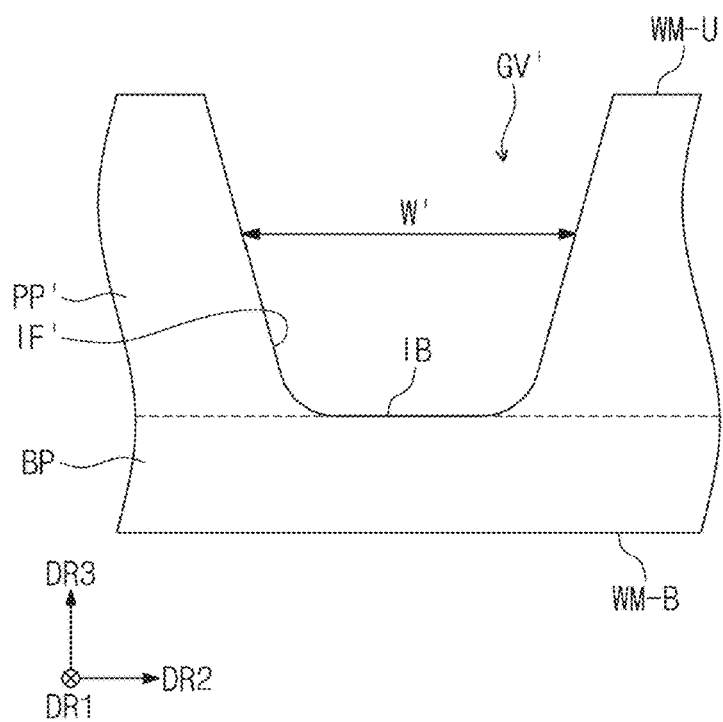

FIGS. 5A and 5B are each a cross-sectional view illustrating a cross-section of a single groove pattern according to an embodiment of the invention. FIGS. 5A and 5B exemplarily show various cross-sectional shapes of the groove pattern.

As shown in FIG. 5A, the groove pattern GV may be formed by being depressed from the upper surface WM-U of the window WM toward the lower surface WM-B, and may be defined as a side surface IF and a bottom surface IB connected to the upper surface WM-U of the window WM. The groove pattern GV may include a bottom surface IB and a side surface IF connected to the bottom surface IB.

The bottom surface IB of the groove pattern GV may be recessed from the upper surface WM-U of the window WM and may be parallel to the upper surface WM-U in an unfolded state. For example, the bottom surface IB of the groove pattern GV may be parallel to each of the first direction DR1 and the second direction DR2. The bottom surface IB of the groove pattern GV is parallel to the upper surface WM-U and may include a substantially flat surface.

On the cross-sectional view, based on the lower surface WM-B of the window WM, the thickness of the groove pattern GV to the bottom surface IB may be less than the thickness (e.g., T1) to the upper surface WM-U based on the lower surface WM-B of the window WM. A thickness from the lower surface WM-B of the window WM to the upper surface WM-U may correspond to the above-described thickness of the window WM. That is, the thickness T1 from the lower surface WM-B of the window WM to the upper surface WM-U may be equal to or more than about 100 micrometers and equal to or less than about 1000 micrometers. A thickness from the lower surface WM-B of the window WM to the bottom surface IB of the groove pattern GV may be about equal to or more than 1 micrometer and equal to or less than about 30 micrometers. A portion of the window WM overlapping the groove pattern GV has a relatively thin thickness, so that the window WM may have improved folding characteristics, and a portion of the window WM that does not overlap the groove pattern GV has a relatively thick thickness, so that the window WM may have impact resistance.

The side surface IF of the groove pattern GV may be bent from the bottom surface IB and the upper surface WM-U of the window WM. The side surface IF of the groove pattern GV may be connected to the bottom surface IB and the upper surface WM-U of the window WM. The side surface IF and the bottom surface IB of the groove pattern GV may be integrally formed.

The side surface IF of the groove pattern GV may include a surface perpendicular to the upper surface WM-U of the window WM and at least one curved surface. For example, the side surface IF of the groove pattern GV may be bendable from the bottom surface IB to have a curved surface having a predetermined curvature. As the side surface IF of the groove pattern GV includes a curved surface, it is possible to prevent stress from being locally concentrated in the lower portion of the window WM during folding, and to prevent the window WM from being damaged by repeated folding operations. The side surface IF of the groove pattern GV may be connected to the upper surface WM-U of the window WM. The side surface IF of the groove pattern GV may include two side surfaces facing each other in the second direction DR2.

The groove pattern GV may have a lower width and an upper width. The lower width of the groove pattern GV may be a width of the bottom surface IB of the groove pattern GV, and the upper width may be a distance between the side surfaces IF of the groove pattern GV on the upper surface WM-U of the window WM. In the groove pattern GV, an upper width may be greater than a lower width. Hereinafter, in the present specification, "width of the groove pattern" may mean the upper width of the groove pattern GV. The width W of the groove pattern GV may be defined along the second direction DR2 crossing the extending direction (i.e., first direction DR1) of the groove pattern GV. The width W of the groove pattern GV in the unfolded state may be, for example, equal to or more than about 20 micrometers and about equal to or less than 300 micrometers.

The side surface IF of the groove pattern GV may be inclined at a predetermined angle with respect to the bottom surface IB. The slope of the side surface IF of the groove pattern GV may correspond to an angle between the side surface IF and the bottom surface IB. The angle between the side surface IF and the bottom surface IB may be, for example, equal to or more than about 90 degrees and equal to or less than about 140 degrees.

Based on one groove pattern GV, the slope of the side surface IF of the groove pattern GV may be variously changed according to a method of forming the groove pattern GV. Also, the width of the groove pattern GV may be substantially equal to or greater than the width of the bottom surface IB according to the curvature, area, or slope of the side surface IF of the curved surface. On the other hand, in this specification, "substantially the same" in width or length may include a case where the numerical values of width or length are exactly the same and a case where the design is the same but there is a difference within the error range that may occur in the process.

In an embodiment, for example, as illustrated in FIG. 5A, the angle between the side surface IF and the bottom surface IB of the groove pattern GV may have a value close to 90 degrees. Accordingly, the side surface IF of the groove pattern GV may be inclined to be substantially perpendicular to the bottom surface IB.

Alternatively, as illustrated in FIG. 5B, the angle between the side surface IF' and the bottom surface IB of the groove pattern GV' may be greater than 90 degrees. The side surface IF' of the groove pattern GV' of FIG. 5B may be more inclined toward the lower surface WM-B of the window WM than the side surface IF of the groove pattern GV illustrated in FIG. 5A. As the angle between the side surface IF' and the bottom surface IB of the groove pattern GV has a value greater than 90 degrees, a difference between the width W' of the groove pattern GV' and the width of the bottom surface IB may increase in the third direction DR3. On the other hand, the embodiments shown in FIGS. 5A and 5B are exemplary, and the groove pattern may have various shapes depending on the slope of the side surface, the curvature and area of the curved surface, the width of the bottom surface, and the like, and is not limited to any one embodiment.

The folding part FP of the window WM includes a base part BP and a plurality of protruding parts PP, and the plurality of groove patterns GV may be defined between two adjacent protruding parts PP of the plurality of protruding parts PP. The plurality of protruding parts PP may have a shape protruding from the base part BP toward the upper surface WM-U of the window WM. The shape of the plurality of protruding parts PP may correspond to the shape of the groove pattern GV. For example, as shown in FIG. 5A, the angle between the side surface IF and the bottom surface IB of the groove pattern GV has a value close to 90 degrees, and accordingly, the protruding part PP may have a rectangular pillar shape having a curved lower portion. Or, as shown in FIG. 5B, the angle between the side surface IF' and the bottom surface IB of the groove pattern GV' is greater than 90 degrees, and accordingly, the protruding part PP' may have a truncated pyramid shape having a curved lower portion.

The plurality of groove patterns GV defined in the folding part FP of the window WM may include patterns having different shapes or widths according to positions in the folding part FP. Alternatively, the protruding parts PP disposed between the plurality of groove patterns GV may have different shapes or widths according to positions in the folding part FP. Hereinafter, various embodiments thereof will be described with reference to the drawings.

Figure 6B:
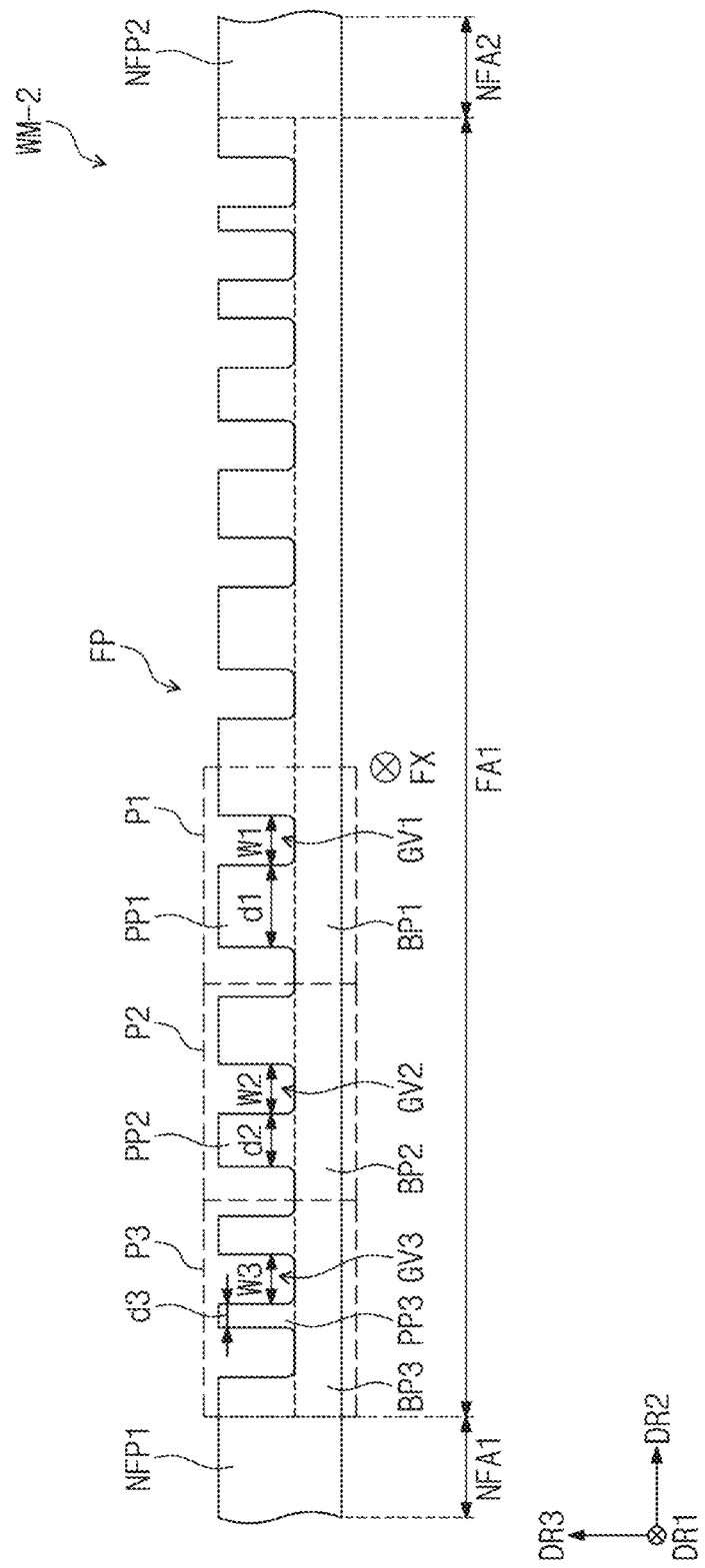
Figure 6C:
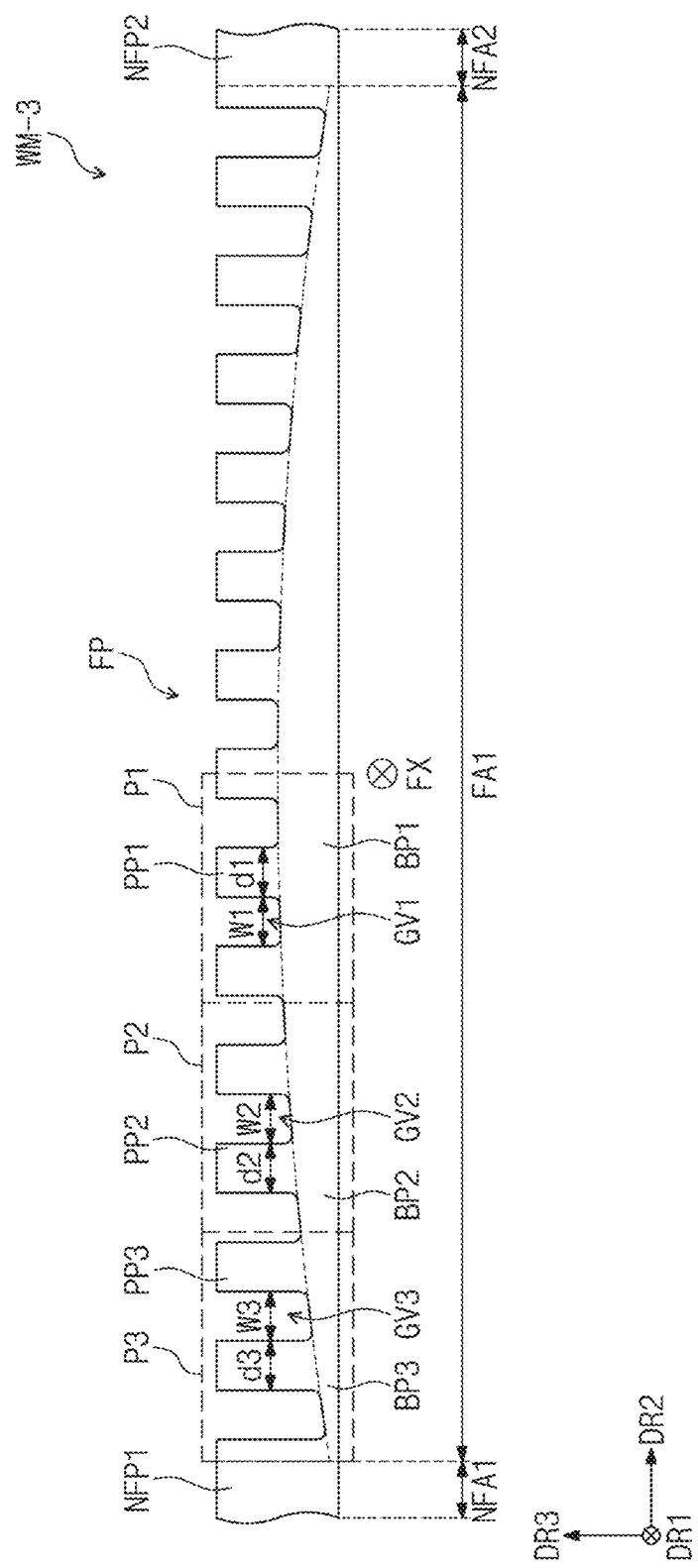

FIGS. 6A to 6C are each a cross-sectional view illustrating a part of a cross-section of a window according to an embodiment of the invention. FIGS. 6A to 6C show the shapes of a plurality of groove patterns, a plurality of protruding parts, and a base part formed in the folding part FP in detail.

Referring to FIGS. 5A and 6A to 6C together, the folding part FP of the windows WM-1, WM-2, and WM-3 according to embodiments include a first part P1, a second part P2, and a third part P3. The first part P1, the second part P2, and the third part P3 may represent parts divided based on the degree of proximity to the folding axis FX in the folding part FP. The first part P1 is a part closest to the folding axis FX, and the second part P2 is a part spaced apart from the folding axis FX compared to the first part P1. The third part P3 is adjacent to the non-folding parts NFP1 and NFP2, and is a part spaced apart from the folding axis FX compared to the first part P1 and the second part P2. Each of the first part P1, the second part P2, and the third part P3 has substantially the same width along the second direction DR2. When the folding part FP of the window WM is divided into a first part P1, a second part P2, and a third part P3, it may be divided to have substantially the same width along the second direction DR2 based on the degree of proximity to the folding axis FX.

In the folding part FP of the window WM according to an embodiment, the volumes of the first part P1, the second part P2, and the third part P3 are different. In the folding part FP, the first part P1 has the largest volume, the second part P2 has a smaller volume than the first part P1, and the third part P3 has a smaller volume than each of the first part P1 and the second part P2. That is, in the folding part FP, the volume per unit width may decrease in a direction (e.g., direction for the folding axis FX to the first non-folding area NFA1) away from the folding axis FX. Here, "unit width" means the width of each group when the folding part FP is divided into a plurality of groups having the same width, such as the first part P1, the second part P2, and the third part P3, and "unit width" includes at least one groove pattern and at least one protruding part. In the folding part FP, the volume of each of the first part P1, the second part P2, and the third part P3 may be the volume of a corresponding part of the window WM excluding empty space defined by the groove pattern GV.

In the folding part FP, as the volumes of the first part P1, the second part P2, and the third part P3 are different, the stiffness of each part may be different. The first part P1 has the largest volume since the space (hereinafter, "first space") occupied by a first groove pattern GV1 is the smallest among groove patterns GV1, GV2, and GV3, the second part P2 has a smaller volume compared to the first part P1, and the third part P3 has a smaller volume compared to each of the first part P1 and the second part P2 since the space (hereinafter, "third space") occupied by a third groove pattern GV3 is the greatest among the groove patterns GV1, GV2, and GV3, such that the rigidity of the first part P1 may be the greatest, the second part P2 may have a greater rigidity than the third part P3, and the rigidity of the third part P3 may be the smallest. That is, in the folding part FP included in the windows WM-1, WM-2, and WM-3 of embodiments, the rigidity per unit width may increase as it approaches the folding axis FX, and the rigidity per unit width may decrease in a direction away from the folding axis FX.

Looking at the cross-section, the cross-sectional area of each of the first part P1, the second part P2, and the third part P3 is different. In the folding part FP, the first part P1 has the largest area in the cross section, the second part P2 has a smaller area in cross section compared to the first part P1, and the third part P3 has a smaller area in cross section than each of the first part P1 and the second part P2. That is, in the folding part FP, the area per unit width may decrease in a direction (e.g., direction opposite to the second direction DR2) away from the folding axis FX. In the folding part FP, the cross-sectional area of each of the first part P1, the second part P2, and the third part P3 may be a cross-sectional area of a portion of the folding part FP excluding a portion defined by the groove pattern GV.

The first part P1, the second part P2, and the third part P3 include at least one groove pattern and at least one protruding part, and a shape of at least one of a groove pattern and a protruding part included in each of the first part P1, the second part P2, and the third part P3 may be different from each other. As the shape of at least one of the groove pattern and the protruding part included in each of the first part P1, the second part P2, and the third part P3 is different, as described above, the volume and cross-sectional area of each of the first part P1, the second part P2, and the third part P3 may be different.

The first part P1 includes at least one first protruding part PP1. The second part P2 includes at least one second protruding part PP2. The third part P3 includes at least one third protruding part PP3. The first protruding part PP1 may have a first protruding width d1, the second protruding part PP2 may have a second protruding width d2, and the third protruding part PP3 may have a third protruding width d3.

At least one first groove pattern GV1 is defined in the first part P1. At least one second groove pattern GV2 is defined in the second part P2. At least one third groove pattern GV3 is defined in the third part P3. The first groove pattern GV1 has a first width W1, the second groove pattern GV2 has a second width W2, and the third groove pattern GV3 has a third width W3. The first width W1, the second width W2, and the third width W3 may each independently be equal to or more than about 20 micrometers and equal to or less than about 300 micrometers.

Although not specifically illustrated, the first part P1, the second part P2, and the third part P3 included in the folding part FP may have a symmetrical shape with respect to the folding axis FX. In FIGS. 6A to 6C, the first part P1, the second part P2, and the third part P3 disposed between the folding axis FX and the first non-folding part NFP1 are exemplarily displayed, but the first part P1, the second part P2, and the third part P3 may be disposed in the same order between the folding axis FX and the second non-folding part NFP2. Accordingly, the plurality of protruding parts PP1, PP2, and PP3 included in the folding part FP may also have a shape symmetrical with respect to the folding axis FX. The plurality of groove patterns GV1, GV2, and GV3 defined in the folding part FP may also have a shape symmetrical with respect to the folding axis FX.

In one embodiment shown in FIG. 6A, the groove patterns GV1, GV2, and GV3 defined in the first part P1, the second part P2, and the third part P3, respectively, may have different shapes. The groove patterns GV1, GV2, and GV3 defined in the first part P1, the second part P2, and the third part P3, respectively, may have different widths in the second direction DR2. In one embodiment, the first width W1 of the first groove pattern GV1 may be less than the second width W2 of the second groove pattern GV2 and the third width W3 of the third groove pattern GV3. The second width W2 of the second groove pattern GV2 may be less than the third width W3 of the third groove pattern GV3. A difference between the first width W1 and the third width W3 may be about 10 micrometers or more.

As each of the groove patterns GV1, GV2, and GV3 defined in the first part P1, the second part P2, and the third part P3, respectively, has a different width from each other in the second direction DR2, the volume of the space defined by the groove patterns GV1, GV2, and GV3 may also be different. In one embodiment, the volume of the first space defined by the first groove pattern GV1 may be less than each volume of a second space defined by the second groove pattern GV2; and a third space defined by the third groove pattern GV3. The volume of the second space defined by the second groove pattern GV2 may be less than the volume of the third space defined by the third groove pattern GV3.

The protruding parts PP1, PP2, and PP3 included in the first part P1, the second part P2, and the third part P3, respectively, may have substantially the same shape. The first protruding width d1 of the first protruding part PP1, the second protruding width d2 of the second protruding part PP2, and the third protruding width d3 of the third protruding part PP3 are mutually may have the same value.

In the embodiment shown in FIG. 6A, the protruding parts PP1, PP2, and PP3 included in the first part P1, the second part P2, and the third part P3, respectively, have the same shape, but the groove patterns GV1, GV2, and GV3 may have different widths W1, W2, and W3 in the second direction DR2, and accordingly, the volume and cross-sectional area of each of the first part P1, the second part P2, and the third part P3 may be different. In the window WM-1 of the embodiment shown in FIG. 6A, the first width W1, the second width W2, and the third width W3 may have a tendency to sequentially increase, and accordingly, the volume of the space occupied by the first groove pattern GV1, the second groove pattern GV2, and the third groove pattern GV3 may have a tendency to sequentially increase. Accordingly, the volume of each of the first part P1, the second part P2, and the third part P3 may have a tendency to sequentially decrease.

In the embodiment illustrated in FIG. 6B, the protruding parts PP1, PP2, and PP3 included in the first part P1, the second part P2, and the third part P3, respectively, may have different shapes. The protruding parts PP1, PP2, and PP3 included in the first part P1, the second part P2, and the third part P3, respectively, may have different widths. In one embodiment, the first protruding width d1 of the first protruding part PP1 in the second direction DR2 may be greater than each of the second protruding width d2 of the second protruding part PP2 and the third protruding width d3 of the third protruding part PP3. The second protruding width d2 of the second protruding part PP2 may be greater than the third protruding width d3 of the third protruding part PP3 in the second direction DR2. A difference between the first protruding width d1 and the third protruding width d3 may be about 10 micrometers or more.

As the protruding parts PP1, PP2, and PP3 defined in the first part P1, the second part P2, and the third part P3 respectively have different widths (e.g., d1, d2, d3) in the second direction DR2 from each other, the proportion of the volume occupied by each of the protruding parts PP1, PP2, and PP3 may also be different. In one embodiment, the ratio of the volume occupied by the first protruding part PP1 in the first part P1 may be greater than each of a ratio of a volume occupied by the second protruding part PP2 in the second part P2 and a ratio of a volume occupied by the third protruding part PP3 in the third part P3. The ratio of the volume occupied by the second protruding part PP2 in the second part P2 may be greater than the ratio of the volume occupied by the third protruding part PP3 in the third part P3.

The groove patterns GV1, GV2, and GV3 defined in the first part P1, the second part P2, and the third part P3, respectively, may have substantially the same shape. The first width W1 of the first groove pattern GV1, the second width W2 of the second groove pattern GV2, and the third width W3 of the third groove pattern GV3 have the same value.

In the embodiment shown in FIG. 6B, the groove patterns GV1, GV2, and GV3 included in the first part P1, the second part P2, and the third part P3, respectively, have the same shape, but the protruding parts PP1, PP2, and PP3 may have different widths d1, d2, and d3 in the second direction DR2, and accordingly, the volume and cross-sectional area of each of the first part P1, the second part P2, and the third part P3 may be different. In the window WM-2 of an embodiment shown in FIG. 6B, the first protruding width d1, the second protruding width d2, and the third protruding width d3 may have a tendency to sequentially decrease, and accordingly, the ratio of the volume of the space occupied by each of the first protruding part PP1, the second protruding part PP2, and the third protruding part PP3 may have a tendency to sequentially decrease. Accordingly, the volume of each of the first part P1, the second part P2, and the third part P3 may have a tendency to sequentially decrease.

In one embodiment shown in FIG. 6C, the groove patterns GV1, GV2, and GV3 defined in the first part P1, the second part P2, and the third part P3, respectively, may have different shapes. The first width W1 of the first groove pattern GV1, the second width W2 of the second groove pattern GV2, and the third width W3 of the third groove pattern GV3 have the same value.

The widths W1, W2, and W3 of the groove patterns GV1, GV2, and GV3 defined in the first part P1, the second part P2, and the third part P3, respectively, are the same, but there may be differences in the recessed depth. The folding part FP in the window WM-3 of an embodiment includes base part BP1, BP2, and BP3, and the average thickness of the base parts BP1, BP2, and BP3 included in the first part P1, the second part P2, and the third part P3, respectively, may be different. The base parts BP1, BP2, and BP3 may have a tendency to increase in thickness as they are adjacent to the folding axis FX in the non-folding parts NFP1 and NFP2. Accordingly, the average thickness of the first base part BP1 included in the first part P1 may be greater than the average thickness of the second base part BP2 included in the second part P2 and the average thickness of the third base part BP3 included in the third part P3. The average thickness of the second base part BP2 included in the second part P2 may be greater than the average thickness of the third base part BP3 included in the third part P3. A difference between the average thickness of the first base part BP1 and the average thickness of the third base part BP3 may be about 10 micrometers or more.

As each of the base parts BP1, BP2, and BP3 included the first part P1, the second part P2, and the third part P3, respectively, has a different average thickness, the volume of the space defined by the groove patterns GV1, GV2, and GV3 may also be different. In one embodiment, the volume of the first space defined by the first groove pattern GV1 may be less than each volume of a second space defined by the second groove pattern GV2; and a third space defined by the third groove pattern GV3. The volume of the second space defined by the second groove pattern GV2 may be less than the volume of the third space defined by the third groove pattern GV3.

In one embodiment shown in FIG. 6C, the first protruding width d1 of the first protruding part PP1, the second protruding width d2 of the second protruding part PP2, and the third protruding width d3 of the third protruding part PP3 are mutually may have the same value.

In the embodiment shown in FIG. 6C, the width of each of the protruding parts PP1, PP2, and PP3 included in the first part P1, the second part P2, and the third part P3, respectively, is the same, but each of the base parts BP1, BP2, and BP3 may have a different average thickness, and accordingly, the volume and cross-sectional area of each of the first part P1, the second part P2, and the third part P3 may be different. In the window WM-3 of an embodiment shown in FIG. 6C, the average thickness of the first base part BP1, the average thickness of the second base part BP2 included in the second part P2, and the average thickness of the third base part BP3 included in the third part P3 are sequentially may have a tendency to sequentially decrease, and accordingly, the volume of the space occupied by the first groove pattern GV1, the second groove pattern GV2, and the third groove pattern GV3 may have a tendency to sequentially increase. Accordingly, the volume of each of the first part P1, the second part P2, and the third part P3 may have a tendency to sequentially decrease.

Figure 7A:
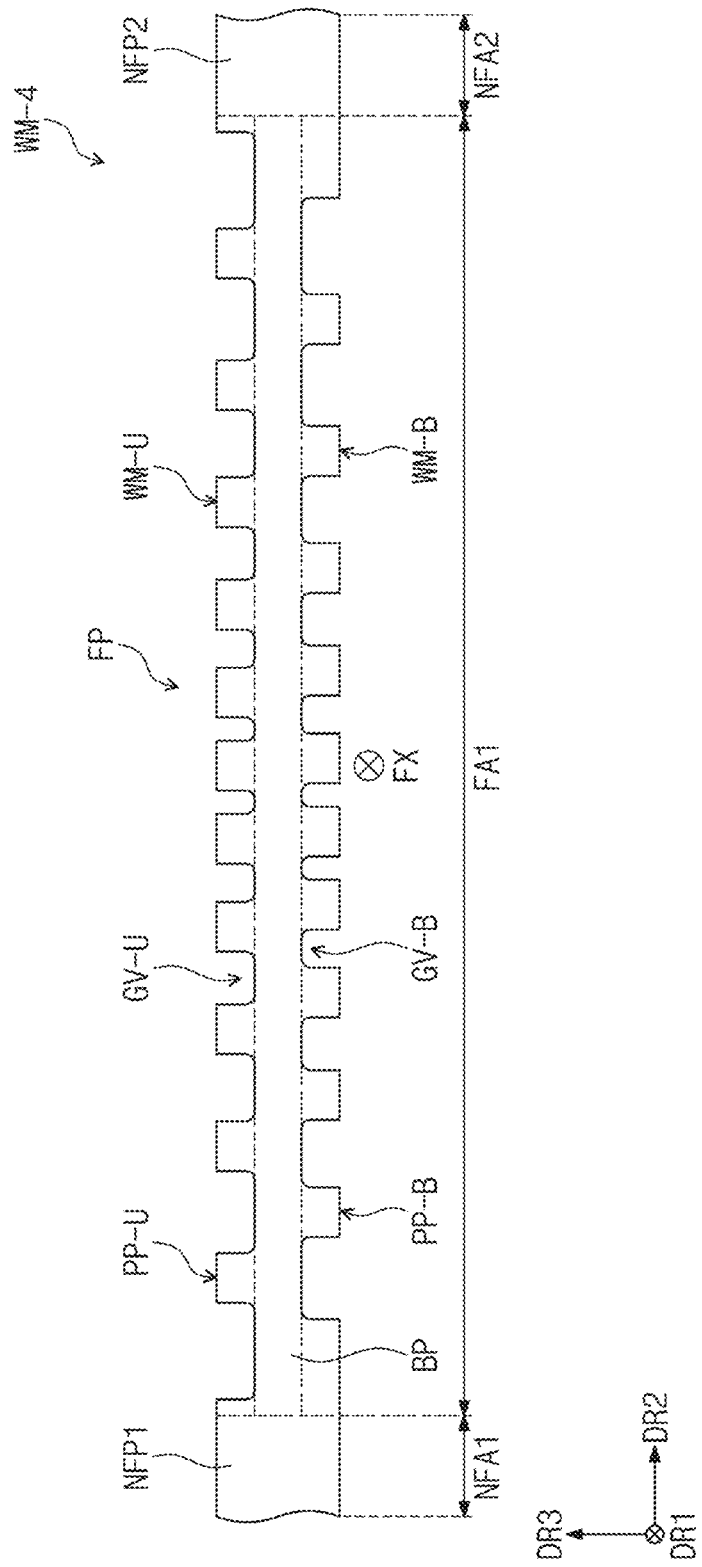

FIGS. 7A to 7C are each a cross-sectional view illustrating a part of a cross-section of a window according to an embodiment of the invention. For a window of an embodiment different from the embodiment shown in FIGS. 6A to 6C, a plurality of groove patterns formed in the folding part FP, a plurality of protruding parts, and shapes of the base part are specifically illustrated in FIGS. 7A to 7C.

Referring to FIGS. 5A and 7A to 7C, in the windows WM-4, WM-5, and WM-6 according to embodiments, a plurality of upper groove patterns GV-U defined on an upper side of the folding part FP, and a plurality of lower groove patterns GV-B defined on a lower side of the folding part FP may be included. The plurality of upper groove patterns GV-U may have a shape recessed from the upper surface WM-U of the windows WM-4, WM-5, and WM-6 toward the base part BP, and the plurality of lower groove patterns GV-B may have a shape recessed from the lower surface WM-B of the windows WM-4, WM-5, and WM-6 in the direction of the base part BP.

As shown in FIGS. 7A and 7B, a plurality of upper protruding parts PP-U may be disposed between the plurality of upper groove patterns GV-U. A plurality of lower protruding parts PP-B may be disposed between the plurality of lower groove patterns GV-B.

A shape of at least one of a groove pattern and a protruding part defined in the windows WM-4, WM-5, and WM-6 according to embodiments may be different from each other. For example, as shown in FIGS. 7A to 7C, each of the plurality of upper groove patterns GV-U and the plurality of lower groove patterns GV-B in the windows WM-4, WM-5, and WM-6 may have a tendency to decrease in width as it approaches the folding axis FX. FIGS. 7A to 7C exemplarily show that the width of the groove pattern decreases as it approaches the folding axis FX as in the embodiment shown in FIG. 6A, but is not limited thereto, and in another embodiment, in the windows WM-4, WM-5, and WM-6 shown in FIGS. 7A to 7C, as shown in FIG. 6B, the width of the protruding part may have a tendency to increase as it approaches the folding axis FX. Alternatively, in the windows WM-4, WM-5, and WM-6 shown in FIGS. 7A to 7C, as shown in FIG. 6C, the average thickness of the base part may have a tendency to increase as it approaches the folding axis FX.

As shown in FIG. 7A, the plurality of upper groove patterns GV-U and the plurality of lower groove patterns GV-B may have a shape alternately disposed along the second direction DR2. That is, the plurality of upper groove patterns GV-U and the plurality of lower groove patterns GV-B may be formed by shifting so as not to completely overlap each other in the third direction DR3 (i.e., in a plan view) and to be slightly misaligned. Alternatively, as shown in FIG. 7B, the plurality of upper groove patterns GV-U and the plurality of lower groove patterns GV-B may have a shape arranged to be aligned along the second direction DR2. That is, the plurality of upper groove patterns GV-U and the plurality of lower groove patterns GV-B may be disposed to completely overlap each other in the third direction DR3 (i.e., in a plan view).

As shown in FIG. 7C, the plurality of upper groove patterns GV-U and the plurality of lower groove patterns GV-B may have an overlapping shape along the second direction DR2. The plurality of upper groove patterns GV-U may have a shape recessed in the direction of the first base part BP1 from the upper surface WM-U of FIG. 5A of the window WM-6, and the plurality of lower groove patterns GV-B may have a shape recessed in the direction of the second base part BP2 from the lower surface WM-B of FIG. 5A of the window WM-6. Accordingly, the plurality of upper groove patterns GV-U and the plurality of lower groove patterns GV-B may partially overlap with each other in the second direction DR2.

Figure 8A:
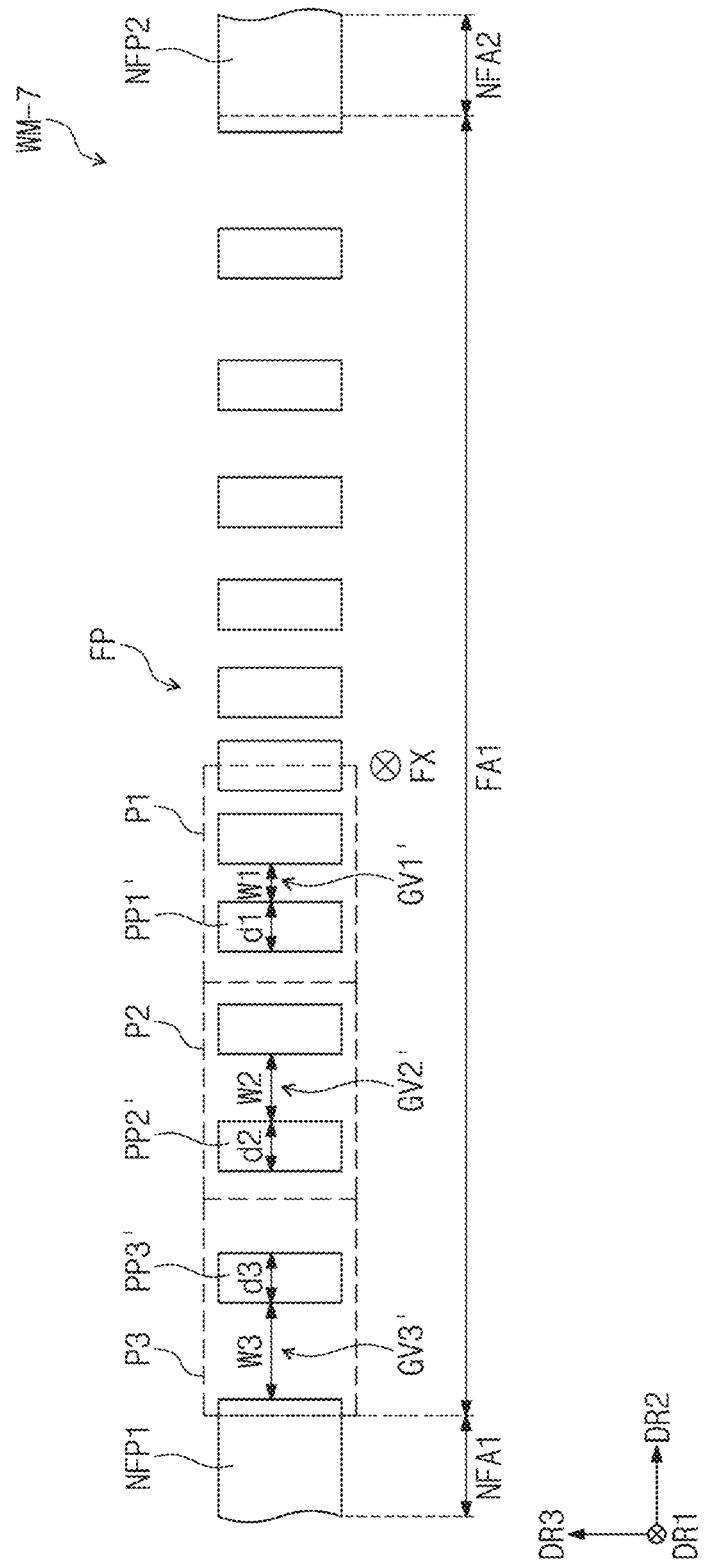

FIGS. 8A and 8B are each a cross-sectional view illustrating a part of a cross-section of a window according to an embodiment of the invention. For a window of an embodiment different from the embodiment shown in FIGS. 6A to 7C, FIGS. 8A and 8B specifically illustrate the shapes of a plurality of groove patterns and protruding parts formed in the folding part FP.

Referring to FIGS. 8A and 8B, in the windows WM-7 and WM-8 according to embodiments, instead of a shape in which each of the plurality of groove patterns GV1', GV2', and GV3' is recessed from either the upper surface WM-U or the lower surface WM-B, patterns in the form of through-holes penetrating from the upper surface WM-U to the lower surface WM-B may be provided. That is, unlike the window shown in FIGS. 6A to 7B, in the windows WM-7 and WM-8 of the embodiments, the base part is omitted, and a plurality of through-holes penetrated from the upper surface WM-U to the lower surface WM-B of the windows WM-7 and WM-8 may be included.

In one embodiment shown in FIG. 8A, the groove patterns GV1', GV2', and GV3' defined in the first part P1, the second part P2, and the third part P3, respectively, may have different shapes. The groove patterns GV1, GV2, and GV3 defined in each of the first part P1, the second part P2, and the third part P3 may have different widths in the second direction DR2. In an embodiment, the first width W1 of the first groove pattern GV1' may be less than the second width W2 of the second groove pattern GV2' and the third width W3 of the third groove pattern GV3'. The second width W2 of the second groove pattern GV2' may be less than the third width W3 of the third groove pattern GV3'. A difference between the first width W1 and the third width W3 may be about 10 micrometers or more.

As each of the groove patterns GV1', GV2', and GV3' defined in the first part P1, the second part P2, and the third part P3, respectively, has a different width from each other in the second direction DR2, the volume of the space defined by the groove patterns GV1', GV2', and GV3' may also be different. In one embodiment, the volume of the first space defined by the first groove pattern GV1' may be less than each volume of a second space defined by the second groove pattern GV2'; and a third space defined by the third groove pattern GV3'. The volume of the second space defined by the second groove pattern GV2' may be less than the volume of the third space defined by the third groove pattern GV3'.

The protruding parts PP1', PP2', and PP3' included in the first part P1, the second part P2, and the third part P3, respectively, may have substantially the same shape. The first protruding width d1 of the first protruding part PP1', the second protruding width d2 of the second protruding part PP2', and the third protruding width d3 of the third protruding part PP3' are mutually may have the same value.

In the embodiment shown in FIG. 8A, the protruding parts PP1', and PP2', PP3' included in the first part P1, the second part P2, and the third part P3, respectively, have the same shape, but the groove patterns GV1', GV2', and GV3' may have different widths W1, W2, and W3 in the second direction DR2, and accordingly, the volume and cross-sectional area of each of the first part P1, the second part P2, and the third part P3 may be different. In the window WM-7 of the embodiment shown in FIG. 8A, the first width W1, the second width W2, and the third width W3 may have a tendency to sequentially increase, and accordingly, the volume of the space occupied by the first groove pattern GV1', the second groove pattern GV2', and the third groove pattern GV3' may have a tendency to sequentially increase. Accordingly, the volume of each of the first part P1, the second part P2, and the third part P3 may have a tendency to sequentially decrease.

In the embodiment illustrated in FIG. 8B, the protruding parts PP1', and PP2', PP3' included in the first part P1, the second part P2, and the third part P3, respectively, may have different shapes. The protruding parts PP1', PP2', and PP3' included in the first part P1, the second part P2, and the third part P3, respectively, may have different widths. In one embodiment, the first protruding width d1 of the first protruding part PP1' may be greater than the second protruding width d2 of the second protruding part PP2' and the third protruding width d3 of the third protruding part PP3', respectively. The second protruding width d2 of the second protruding part PP2' may be greater than the third protruding width d3 of the third protruding part PP3'. A difference between the first protruding width d1 and the third protruding width d3 may be about 10 micrometers or more.

As each of the protruding parts PP1', PP2', and PP3' defined in the first part P1, the second part P2, and the third part P3, respectively, has a different width in the second direction DR2, the proportion of the volume occupied by each of the protruding parts PP1', PP2', and PP3' may also be different. In one embodiment, the ratio of the volume occupied by the first protruding part PP1' in the first part P1 may be greater than a ratio of a volume occupied by the second protruding part PP2' in the second part P2 and a ratio of a volume occupied by the third protruding part PP3' in the third part P3, respectively. The ratio of the volume occupied by the second protruding part PP2' in the second part P2 may be greater than the ratio of the volume occupied by the third protruding part PP3' in the third part P3.

The groove patterns GV1', GV2', and GV3' defined in the first part P1, the second part P2, and the third part P3, respectively, may have substantially the same shape. The first width W1 of the first groove pattern GV1', the second width W2 of the second groove pattern GV2', and the third width W3 of the third groove pattern GV3' have the same value.

In the embodiment shown in FIG. 8B, the groove patterns GV1', GV2', and GV3' included in the first part P1, the second part P2 and the third part P3, respectively, have the same shape, but the protruding parts PP1', PP2', and PP3' may have different widths d1, d2, and d3 in the second direction DR2, and accordingly, the volume and cross-sectional area of each of the first part P1, the second part P2, and the third part P3 may be different. In the window WM-8 of an embodiment shown in FIG. 8B, the first protruding width d1, the second protruding width d2, and the third protruding width d3 may have a tendency to sequentially decrease, and accordingly, the ratio of the volume of the space occupied by each of the first protruding part PP1', the second protruding part PP2', and the third protruding part PP3' may have a tendency to sequentially decrease. Accordingly, the volume of each of the first part P1, the second part P2, and the third part P3 may have a tendency to sequentially decrease.

Figure 9:
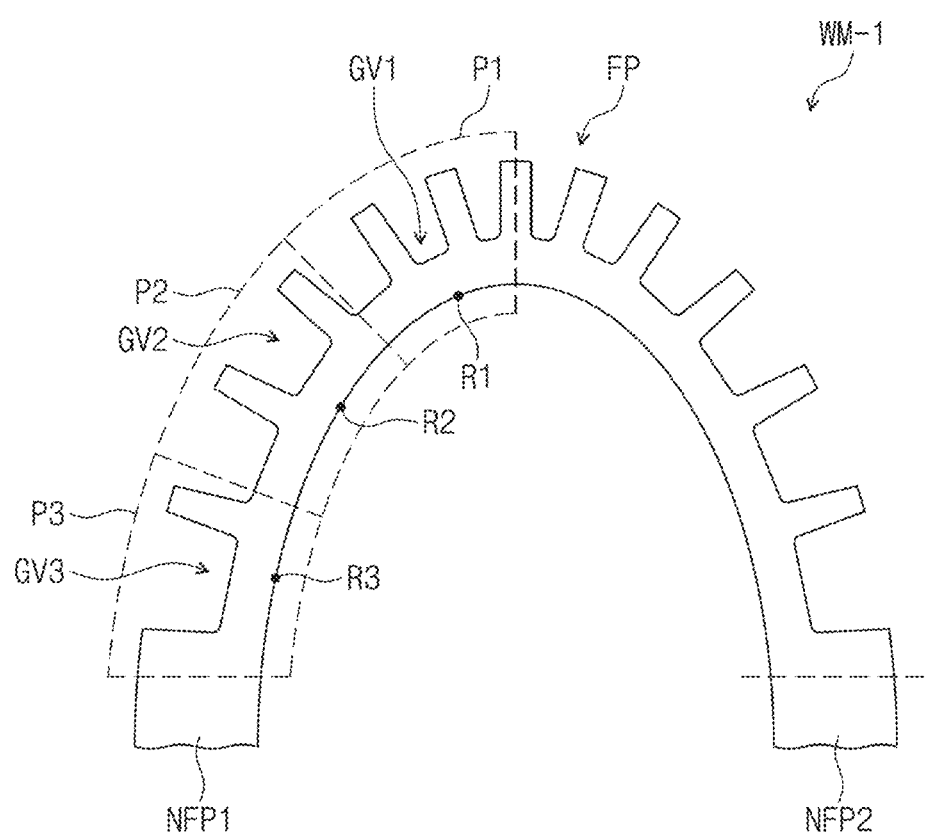
FIG. 9 is a cross-sectional view of a window in a folded state according to an embodiment of the invention.

FIG. 9 is a cross-sectional view of a window in a folded state according to an embodiment of the invention. FIG. 9 shows a cross-section of the window WM-1 in a folded state based on the cross-section of the window WM-1 according to the embodiment shown in FIG. 6A. In FIG. 9, the window WM-1 of the embodiment shown in FIG. 6A is exemplarily shown and described, and this description is equally applicable to the windows WM-2, WM-3, WM-4, WM-5, WM-6, WM-7, and WM-8 of other embodiments shown in FIGS. 6B to 8B.

Referring to FIGS. 6A and 9, when the window WM-1 according to an embodiment is folded with respect to the folding axis FX, the window WM-1 according to an embodiment may be folded to have a parabolic shape instead of being folded in a circular shape. As the window WM-1 of one embodiment is folded to have a parabolic shape, a radius of curvature of a portion adjacent to the folding axis FX and a portion spaced apart from the folding axis FX in the folding part FP may be different from each other. In the folding part FP of the window WM-1 according to an embodiment, the radius of curvature may have a tendency to increase as the distance from the folding axis FX increases.

The folding part FP in the window WM-1 of an embodiment includes a first part P1, a second part P2, and a third part P3, and in the folded state, the radii of curvatures at the first point R1 of the first part P1, the second point R2 of the second part P2, and the third point R3 of the third part P3 may be different from each other. A radius of curvature at the first point R1 may be less than each of the radii of curvatures at the second point R2 and the third point R3. The radius of curvature at the second point R2 may be less than the radius of curvature at the third point R3.

Referring to FIGS. 6A to 8B and FIG. 9, in the window of one embodiment, the folding part FP is folded in a parabolic shape rather than a circle, and accordingly, the radius of curvature is different in each part of the folding part FP. More specifically, a portion adjacent to the folding axis FX in the folding part FP may have a small radius of curvature, and the radius of curvature may increase in a direction away from the folding axis FX. Accordingly, in the folding part FP, a portion adjacent to the folding axis FX may receive a large stress during folding, and the applied stress may decrease in a direction away from the folding axis FX.

The window according to an embodiment of the invention includes a first part P1, a second part P2, and a third part P3 divided based on the degree of proximity to the folding axis FX within the folding part FP, and the first part P1 has the largest volume, and the second part P2 has a smaller volume than the first part P1, and the third part P3 has a smaller volume than the first part P1 and the second part P2. That is, in the folding part FP, the volume per unit width may be formed to decrease in a direction away from the folding axis FX in the second direction DR2. Accordingly, the window according to an embodiment of the invention may have a structure in which stiffness per unit width increases as it approaches the folding axis FX. Accordingly, stress applied during folding may be distributed from a portion adjacent to the folding axis FX to a portion far from the folding axis FX. Therefore, the window according to an embodiment of the invention may prevent the stress applied during folding from being concentrated in a portion adjacent to the folding axis FX, and it is possible to provide a window and a display device with improved durability by preventing the window from being damaged due to folding.

Figure 10:
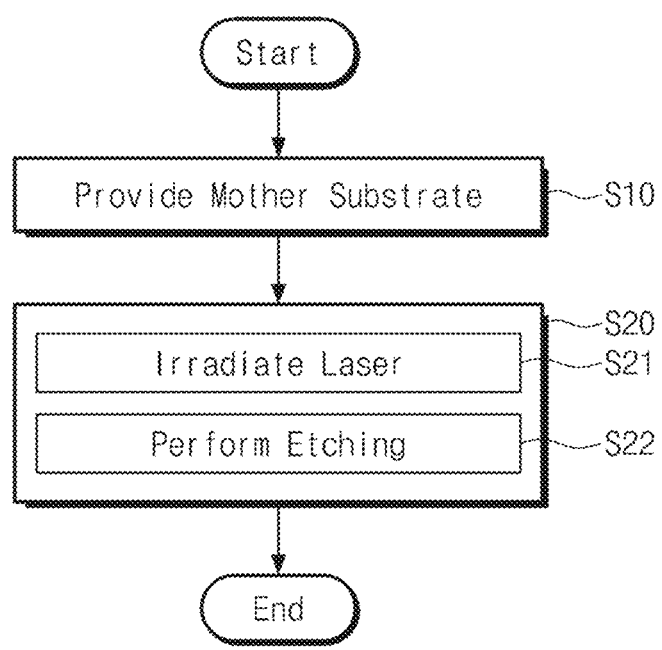
FIG. 10 is a flowchart illustrating a method of manufacturing a window according to an embodiment.

FIG. 10 is a flowchart illustrating a method of manufacturing a window according to an embodiment. Referring to FIG. 10, the method of manufacturing a window may include providing a mother substrate in operation S10 and forming a groove pattern in operation S20.

The mother substrate provided in operation S10 of providing the mother substrate is a substrate for manufacturing a window, and may correspond to a substrate before groove patterns are formed. The mother substrate provided in operation S10 of providing the mother substrate may be a glass substrate that has not been strengthened or is not limited thereto, and may be a strengthened glass substrate that has undergone a strengthening operation according to a manufacturing operation in another embodiment. In the mother substrate, virtual lines defined in the extending direction of the groove pattern may be defined to form the groove pattern.

Thereafter, a groove pattern may be formed on the mother substrate in operation S20. Operation S20 of forming the groove pattern may include operation S21 of irradiating a laser and operation S22 of performing an etching operation.

The laser irradiated in operation S21 of irradiating the laser may overlap the irradiation point to change the refractive index of a portion of the mother substrate. A part of the laser-irradiated mother substrate may be transformed into a material phase by the laser, and the refractive index of the laser-irradiated points and the refractive index of the non-laser-irradiated mother substrate may be different.

Operation S22 of performing an etching operation may include a wet-etching operation of providing an etching solution on the laser-irradiated point. The method of providing the etching solution includes a spray method in which the etching solution is sprayed onto the point of the mother substrate irradiated with a laser, or a dipping method in which the mother substrate is immersed in the etching solution, but the invention is not limited thereto. The etching solution provided in an embodiment of the invention may include an alkali solution.

Hereinafter, each operation of the method for manufacturing a window according to an embodiment of the invention will be described in detail with reference to each drawing.

Figure 11A:
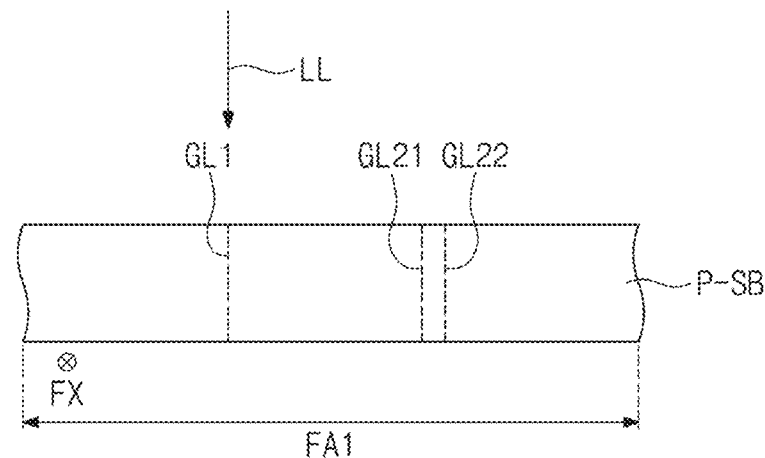
FIGS. 11A to 11C are cross-sectional views illustrating a step of a method of manufacturing a window according to an embodiment.
Figure 11A:
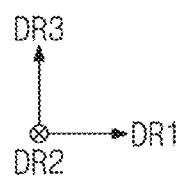
Figure 11B:
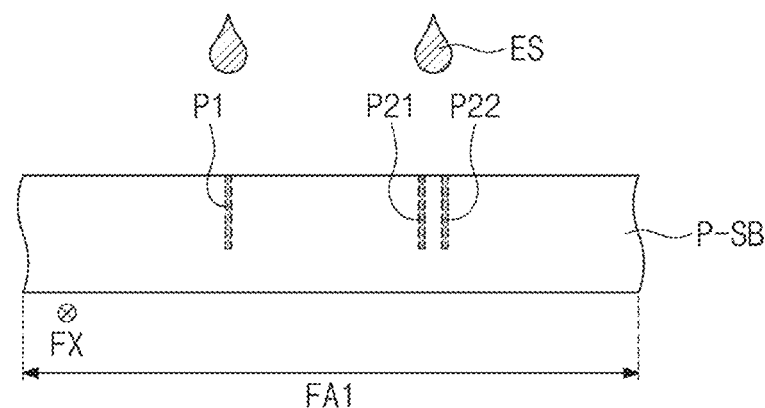
Figure 11B:
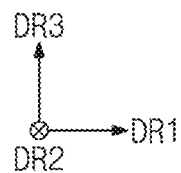
Figure 11C:
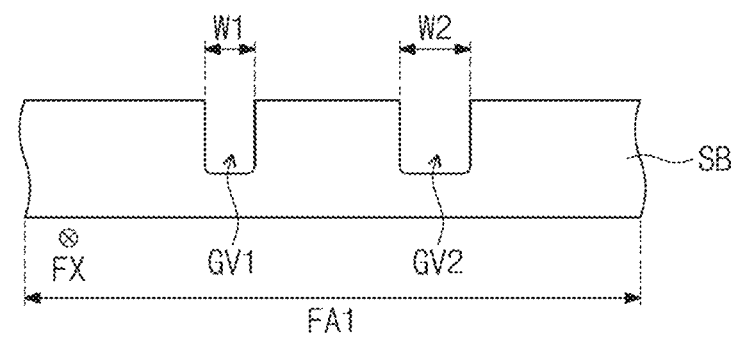

FIGS. 11A to 11C are cross-sectional views illustrating an operation of a method of manufacturing a window according to an embodiment.

Referring to FIG. 11A, virtual lines GL1, GL21, and GL22 for forming groove patterns may be defined on the folding area FA1 of the mother substrate P-SB. The lines GL1, GL21, and GL22 may correspond to formation positions of the groove patterns to be formed, and may be defined in parallel to an extension direction of the groove patterns to be formed.

For convenience of description, in FIG. 11A, lines GL1, GL21, and GL22 defined to form two groove patterns extending parallel to the folding axis FX are exemplarily illustrated. The lines GL1, GL21, and GL22 may be defined to correspond to each of the groove patterns to be formed, and then, each line will be referred to as a first line GL1 and second lines GL21 and GL22.

The laser LL may be irradiated toward the thickness direction of the mother substrate P-SB on the mother substrate P-SB. The laser LL may be irradiated on a plurality of points to overlap the lines GL1, GL21, and GL22.

Unlike the first line GL1, the laser LL may be provided in a plurality of columns with respect to the lines GL1, GL21, and GL22. Accordingly, the width of the second groove pattern GV2 formed at the position where the second lines GL21 and GL22 are defined may be greater than the first groove pattern GV1 formed at the position where the first line GL1 is defined.

The points irradiated with the laser LL may have a phase change while local melting occurs by the laser LL, and thus a refractive index may change. The refractive index of the points where the laser LL is irradiated may be different from the refractive index of the mother substrate P-SB before the laser LL is irradiated. The laser LL may have an intensity that changes the refractive index of a portion of the mother substrate P-SB without cutting a portion of the mother substrate P-SB.

The laser LL may have pulse energy. The pulse duration of the laser LL may range from several hundred picoseconds to several tens of femtoseconds. For example, the pulse duration of the laser LL may be about 200 picoseconds or less. The pulse duration of the laser LL may vary depending on the material or thickness of the mother substrate P-SB. The wavelength of the laser LL may be equal to or more than about 250 nanometers (nm) and equal to or less than about 1500 nm, and specifically, equal to or more than about 340 nm and equal to or less than about 1060 nm.

The laser LL may be a non-diffractive beam. For example, the laser LL may be a Bessel beam. However, the invention is not limited thereto, and in another embodiment, the laser LL may be a Gaussian beam.

FIG. 11B shows a cross-sectional view of the mother substrate P-SB after laser irradiation. For convenience of explanation, the laser-irradiated portions P1, P21, and P22 are illustrated as hatched regions, but substantially, the laser-irradiated portions P1, P21, and P22 are minute and may be difficult to identify with the naked eye.

After the laser is irradiated, the refractive indices of the first parts P1 and the second parts P21 and P22 may be different from the refractive indices of the mother substrate P-SB before the laser is irradiated.

Each of the first parts P1 and the second parts P21 and P22 may be formed to have a predetermined diameter on a plane. For example, a diameter of each of the first parts P1 and the second parts P21 and P22 may be about 3 μm or less. Since the laser LL changes the refractive index without forming a physical hole in the mother substrate P-SB and the size of the parts where the refractive index is changed is also small, changes in the appearance of the mother substrate P-SB by the laser may not be easily recognized, and may be visually recognized using a high-magnification microscope.

Each of the first parts P1 and the second parts P21 and P22 may be formed to be spaced apart from each other by a predetermined interval along the second direction DR2. An interval between each of the first parts P1 and the second parts P21 and P22 may be on a scale of several micrometers (μm).

The first parts P1 and the second parts P21 and P22 may be spaced apart by a predetermined interval along the first direction DR1. The spacing between the groove patterns GV1 and GV2 to be formed may vary according to the spacing between the first parts P1 and the second parts P21 and P22.

Each of the first parts P1 and the second parts P21 and P22 may have a predetermined thickness along the thickness direction. The thickness of each of the first parts P1 and the second parts P21 and P22 may be less than the thickness of the mother substrate P-SB. By adjusting the intensity of the laser, the thickness of the first parts P1 and the second parts P21 and P22 may be controlled. The depths of the first and second groove patterns GV1 and GV2 to be formed may vary according to the thicknesses of the first parts P1 and the second parts P21 and P22.

As described above, as the second lines GL21 and GL22 are provided in a plurality of columns, the second parts P21 and P22 may also be formed in a plurality of columns. Compared to the width of the second groove pattern GV2 formed by the second parts P21 and P22 formed in a plurality of columns along the first direction DR1, the width of the first groove pattern GV1 formed by the first parts P1 formed in one row may be smaller.

The etching solution ES may be provided on the first and second parts P1, P21, and P22. The etching solution ES may be provided by a spray method or a dipping method, and is not limited to any one embodiment. The etching solution ES may etch a portion of the mother substrate P-SB centered on the first and second parts P1, P21, and P22 in another embodiment.

The etching solution ES may include an alkali solution. For example, the etching solution ES may include a sodium hydroxide (NaOH) solution or a potassium hydroxide (KOH) solution, and preferably, the etching solution ES may include a sodium hydroxide solution. As the etching solution ES contains the alkali solution, the groove patterns GP1 and GP2 may be formed to have a bottom surface parallel to the upper surface of the substrate and a side surface including at least one curved surface as described above. If the etching solution contains an acid solution such as a hydrogen fluoride solution, a sharp groove pattern may be formed toward the lower surface of the mother substrate P-SB, and it may be difficult to form the shape of the groove pattern of an embodiment.

The shape of the groove patterns may vary depending on an etch rate or an etch amount. As the concentration and temperature of the etching solution ES increase, the etching rate may increase. The amount of etching may increase as the exposure time to the etching solution ES, that is, the etching time increases.

In particular, as the temperature of the etching solution ES increases, the reactivity of the etching solution ES may increase, thereby increasing the etching rate. The temperature of the etching solution ES may be higher than or equal to room temperature. For example, the temperature of the etching solution ES may be equal to or more than about 100 degrees and equal to or less than about 150 degrees. When the temperature of the etching solution ES is lower than 100 degrees, the reactivity of the etching solution ES may decrease, and a process time for forming the groove pattern may increase. If the temperature of the etching solution ES is higher than 150 degrees, the mother substrate P-SB may be damaged by exposure to high temperature.

FIG. 11C is a cross-sectional view illustrating the substrate SB on which the groove patterns GV1 and GV2 are formed after a predetermined time after exposure to the etching solution ES in the state of one operation shown in FIG. 11B.

The plurality of groove patterns GV1 and GV2 may be formed such that a portion of the substrate SB is depressed through operation S21 for the laser irradiation and operation S22 for etching described above. Here, the substrate SB may correspond to the mother substrate P-SB on which the plurality of groove patterns GV1 and GV2 are formed. For the description of the plurality of groove patterns GV1 and GV2, the above description may be equally applied.

In an embodiment, the first width W1 of the first groove pattern GV1 may be less than the second width W2 of the second groove pattern GV2. In the window manufacturing method of one embodiment, the first parts P1 formed through laser LL irradiation may be formed in one column, and the second parts P21 and P22 may be formed in a plurality of columns, and accordingly, the first width W1 of the first groove pattern GV1 may be formed to be less than the second width W2 of the second groove pattern GV2. However, the embodiment is not limited to that shown in FIGS. 11A to 11C, and in the window manufacturing method of one embodiment, to fabricate the window of the various embodiments shown in FIGS. 6A to 8B, the number of columns of laser irradiated to a position where each groove pattern is formed, a laser irradiating time, an interval between irradiated positions of the laser, the intensity of the laser, and the like may be adjusted.

According to one embodiment of the invention, the window may have a structure in which a groove pattern and a protruding part are provided to the folding part, and at least one of the shape of the groove pattern and the shape of the protruding part is different in a direction away from the folding axis. Accordingly, the window has a structure in which rigidity increases as it approaches the folding axis and decreases in a direction away from the folding axis, thereby preventing the stress applied during folding from being concentrated, and it is possible to provide a window and a display device with improved durability by preventing the window from being damaged due to folding.

Although the embodiments of the invention have been described, it is understood that the invention should not be limited to these embodiments but various changes and modifications may be made by one ordinary skilled in the art within the spirit and scope of the invention as hereinafter claimed.

What is claimed is:

1. A window comprising:
a folding part that is foldable with respect to a virtual folding axis extending in a first direction; and
a first non-folding part and a second non-folding part spaced apart from each other in a second direction perpendicular to the first direction with the folding part therebetween,
wherein a plurality of groove patterns extending in the first direction and arranged in the second direction are defined in the folding part,
wherein the folding part comprises:
a first part adjacent to the folding axis;
a second part spaced apart from the folding axis more than the first part; and
a third part adjacent to one of the first non-folding part and the second non-folding part, and spaced apart from the folding axis more than each of the first part and the second part,
wherein widths of the first part, the second part and the third part in the second direction are the same,
wherein a volume of the first part is greater than a volume of the second part, and the volume of the second part is greater than a volume of the third part,
wherein the plurality of groove patterns comprises:
a first groove pattern defined in the first part;
a second groove pattern defined in the second part; and
a third groove pattern defined in the third part,
wherein the first groove pattern has a first width along the second direction,
wherein the second groove pattern has a second width along the second direction,
wherein the third groove pattern has a third width along the second direction,
wherein the first width is less than the second width, and the second width is less than the third width.

2. The window of claim 1,
wherein a volume of a first space defined by the first groove pattern is less than a volume of a second space defined by the second groove pattern, and the volume of the second space is less than a volume of a third space defined by the third groove pattern.

3. The window of claim 2, wherein the folding part comprises:
a base part; and
a plurality of protruding parts disposed on the base part, where each of the plurality of groove patterns is defined therebetween,
wherein the base part comprises:
a first base part included in the first part;
a second base part included in the second part; and
a third base part included in the third part,
wherein an average thickness of the first base part is greater than an average thickness of the second base part, and the average thickness of the second base part is greater than an average thickness of the third base part.

4. The window of claim 1, wherein a difference between the first width and the third width is at least about 10 micrometers.

5. The window of claim 1, wherein the folding part comprises a plurality of protruding parts in which the plurality of groove patterns are defined therebetween,
wherein the plurality of protruding parts comprise:
a first protruding part included in the first part;
a second protruding part included in the second part; and
a third protruding part included in the third part,
wherein the first protruding part has a first protruding width along the second direction,
wherein the second protruding part has a second protruding width along the second direction,
wherein the third protruding part has a third protruding width along the second direction,
wherein the first protruding width is greater than the second protruding width, and the second protruding width is greater than the third protruding width.

6. The window of claim 1, wherein a thickness of the window is equal to or more than about 100 micrometers and equal to or less than about 1000 micrometers.

7. The window of claim 1, wherein the folding part comprises:
an upper surface; and
a lower surface opposite to the upper surface,
wherein the plurality of groove patterns comprise:
a plurality of upper groove patterns recessed from the upper surface; and
a plurality of lower groove patterns recessed from the lower surface.

8. The window of claim 7, wherein the plurality of upper groove patterns and the plurality of lower groove patterns are alternately disposed along the second direction.

9. The window of claim 7, wherein the plurality of upper groove patterns and the plurality of lower groove patterns are disposed so as to completely overlap each other in a plan view.

10. The window of claim 1, wherein the folding part comprises:
an upper surface; and
a lower surface opposite to the upper surface,
wherein the plurality of groove patterns have a through-hole shape passing through the lower surface from the upper surface.

11. The window of claim 1, wherein the plurality of groove patterns are symmetrical with respect to the folding axis.

12. The window of claim 1, wherein widths of the plurality of groove patterns in the second direction are each equal to or more than about 20 micrometers and equal to or less than about 300 micrometers.

13. The window of claim 1, wherein in a state in which the window is folded, a radius of curvature of the first part is less than a radius of curvature of the second part, and the radius of curvature of the second part is less than a radius of curvature of the third part.

14. The window of claim 1, wherein the plurality of groove patterns does not overlap the first non-folding part and the second non-folding part in an unfolded state.

15. A window comprising:
a folding part that is foldable with respect to a virtual folding axis extending in a first direction; and
a first non-folding part and a second non-folding part spaced apart from each other in a second direction perpendicular to the first direction with the folding part therebetween,
wherein a plurality of groove patterns extending in the first direction and arranged in the second direction are defined in the folding part,
wherein the folding part comprises:
an upper surface; and
a lower surface opposite to the upper surface,
wherein the plurality of groove patterns comprise:
a plurality of upper groove patterns recessed from the upper surface; and a plurality of lower groove patterns recessed from the lower surface, wherein the plurality of upper groove patterns partially overlap the plurality of lower groove patterns in the second direction in a cross-sectional view.

16. A display device comprising:

a foldable display module; and a window disposed on the display module and foldable together with the display module, wherein the window comprises:

a folding part that is foldable with respect to a virtual folding axis extending in a first direction; and a first non-folding part and a second non-folding part spaced apart from each other in a second direction perpendicular to the first direction with the folding part therebetween, wherein a plurality of groove patterns extending in the first direction and arranged in the second direction are defined in the folding part, wherein the folding part comprises:

a first part adjacent to the folding axis;

a second part spaced apart from the folding axis more than the first part; and a third part adjacent to one of the first non-folding part and the second non-folding part, and spaced apart from the folding axis more than each of the first part and the second part, wherein widths of the first part, the second part and the third part in the second direction are the same, wherein a volume of the first part is greater than a volume of the second part, and the volume of the second part is greater than a volume of the third part, wherein the plurality of groove patterns comprises:

a first groove pattern defined in the first part;

a second groove pattern defined in the second part; and a third groove pattern defined in the third part, wherein the first groove pattern has a first width along the second direction, wherein the second groove pattern has a second width along the second direction, wherein the third groove pattern has a third width along the second direction, wherein the first width is less than the second width, and the second width is less than the third width.

17. The display device of claim 16, wherein the folding part comprises:

a lower surface adjacent to the display module; and an upper surface facing the lower surface and spaced apart from the display module with the lower surface therebetween, wherein the plurality of groove patterns comprises:

a bottom surface recessed from the upper surface and parallel to the upper surface in an unfolded state; and a side surface connecting the bottom surface and the upper surface.

18. The display device of claim 16, wherein a volume of a first space defined by the first groove pattern is less than a volume of a second space defined by the second groove pattern, and the volume of the second space is less than a volume of a third space defined by the third groove pattern.

19. The display device of claim 16, wherein the folding part comprises:

a base part; and a plurality of protruding parts disposed on the base part, where the plurality of groove patterns is defined therebetween, wherein the plurality of protruding parts comprise:

a first protruding part included in the first part;

a second protruding part included in the second part; and a third protruding part included in the third part, wherein the first protruding part has a first protruding width along the second direction, wherein the second protruding part has a second protruding width along the second direction, wherein the third protruding part has a third protruding width along the second direction, wherein the first protruding width is greater than the second protruding width, and the second protruding width is greater than the third protruding width.

* * * * *